(12) United States Patent
Makala et al.

(10) Patent No.: US 9,842,907 B2
(45) Date of Patent: Dec. 12, 2017

(54) MEMORY DEVICE CONTAINING COBALT SILICIDE CONTROL GATE ELECTRODES AND METHOD OF MAKING THEREOF

(71) Applicant: SANDISK TECHNOLOGIES INC., Plano, TX (US)

(72) Inventors: Raghuveer S. Makala, Campbell, CA (US); Sateesh Koka, Milpitas, CA (US); Zhenyu Lu, Milpitas, CA (US); Somesh Peri, San Jose, CA (US); Rahul Sharangpani, Fremont, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 23 days.

(21) Appl. No.: 14/869,406

(22) Filed: Sep. 29, 2015

(65) Prior Publication Data

US 2017/0092733 A1   Mar. 30, 2017

(51) Int. Cl.
*H01L 21/8239* (2006.01)
*H01L 29/49* (2006.01)
(Continued)

(52) U.S. Cl.
CPC .... *H01L 29/4975* (2013.01); *H01L 21/28273* (2013.01); *H01L 21/28282* (2013.01);
(Continued)

(58) Field of Classification Search
CPC ........... H01L 29/4975; H01L 27/11582; H01L 27/11556; H01L 27/11524;
(Continued)

(56) References Cited

U.S. PATENT DOCUMENTS

| 7,005,350 B2 | 2/2006 | Walker et al. |
| 7,023,739 B2 | 4/2006 | Chen et al. |

(Continued)

FOREIGN PATENT DOCUMENTS

| WO | WO02/15277 A2 | 2/2002 |
| WO | WO2013/154963 A2 | 10/2013 |

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.
(Continued)

*Primary Examiner* — Mary Wilczewski
(74) *Attorney, Agent, or Firm* — The Marbury Law Group PLLC

(57) ABSTRACT

An alternating stack of insulating layers and sacrificial material layers can be formed over a substrate. Memory stack structures and a backside trench are formed through the alternating stack. Backside recesses are formed by removing the sacrificial material layers from the backside trench selective to the insulating layers. A cobalt-semiconductor alloy portion is formed in each backside recess by reacting cobalt and a semiconductor material. Conductive material in the backside trench can be removed by an etch to electrically isolate cobalt-containing alloy portions located in different backside recesses. Electrically conductive layers including a respective cobalt-semiconductor alloy portion can be employed as word lines of a three-dimensional memory device.

9 Claims, 21 Drawing Sheets

(51) Int. Cl.
*H01L 27/11524* (2017.01)
*H01L 27/11556* (2017.01)
*H01L 27/1157* (2017.01)
*H01L 27/11582* (2017.01)
*H01L 29/788* (2006.01)
*H01L 21/28* (2006.01)
*H01L 21/285* (2006.01)
*H01L 27/11568* (2017.01)

(52) U.S. Cl.
CPC .... *H01L 21/28518* (2013.01); *H01L 27/1157* (2013.01); *H01L 27/11524* (2013.01); *H01L 27/11556* (2013.01); *H01L 27/11568* (2013.01); *H01L 27/11582* (2013.01); *H01L 29/7883* (2013.01)

(58) Field of Classification Search
CPC ........... H01L 27/11568; H01L 27/1157; H01L 21/28282; H01L 21/28273; H01L 21/28518
USPC ........................................................ 257/314
See application file for complete search history.

(56) References Cited

U.S. PATENT DOCUMENTS

| | | | |
|---|---|---|---|
| 7,177,191 B2 | 2/2007 | Fasoli et al. | |
| 7,221,588 B2 | 5/2007 | Fasoli et al. | |
| 7,233,522 B2 | 6/2007 | Chen et al. | |
| 7,514,321 B2 | 4/2009 | Mokhlesi et al. | |
| 7,575,973 B2 | 8/2009 | Mokhlesi et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi | |
| 8,053,829 B2 | 11/2011 | Kang et al. | |
| 8,324,677 B2* | 12/2012 | Lee | H01L 21/28282 257/314 |
| 8,349,681 B2 | 1/2013 | Alsmeier et al. | |
| 8,797,800 B1* | 8/2014 | Dong | H01L 27/11551 365/185.05 |
| 8,847,302 B2 | 9/2014 | Alsmeier et al. | |
| 8,865,579 B2* | 10/2014 | Lee | H01L 21/28282 257/316 |
| 8,872,252 B2* | 10/2014 | Jindal | H01L 27/11556 257/315 |
| 8,928,061 B2 | 1/2015 | Chien et al. | |
| 9,147,468 B1* | 9/2015 | Lue | G11C 11/5671 |
| 9,224,753 B2* | 12/2015 | Lim | H01L 27/11556 |
| 9,343,478 B2* | 5/2016 | Lee | H01L 21/28282 |
| 9,391,089 B2* | 7/2016 | Youn | H01L 27/11582 |
| 9,646,975 B2* | 5/2017 | Peri | H01L 27/115 |
| 2006/0091556 A1* | 5/2006 | Shigeoka | H01L 21/8221 257/773 |
| 2007/0158736 A1* | 7/2007 | Arai | H01L 27/105 257/315 |
| 2007/0210338 A1 | 9/2007 | Orlowski | |
| 2007/0252201 A1 | 11/2007 | Kito et al. | |
| 2009/0242967 A1 | 10/2009 | Katsumata et al. | |
| 2010/0044778 A1 | 2/2010 | Seol | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho | |
| 2010/0181610 A1 | 7/2010 | Kim et al. | |
| 2010/0207185 A1* | 8/2010 | Lee | H01L 21/28282 257/314 |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0266606 A1 | 11/2011 | Park et al. | |
| 2011/0294290 A1* | 12/2011 | Nakanishi | H01L 27/11551 438/666 |
| 2012/0001247 A1 | 1/2012 | Alsmeier | |
| 2012/0001249 A1 | 1/2012 | Alsmeier | |
| 2012/0001250 A1* | 1/2012 | Alsmeier | H01L 27/11551 257/319 |
| 2012/0001252 A1* | 1/2012 | Alsmeier | H01L 27/11551 257/321 |
| 2012/0012920 A1 | 1/2012 | Shin et al. | |
| 2012/0241846 A1* | 9/2012 | Kawasaki | H01L 29/7926 257/326 |
| 2013/0032870 A1* | 2/2013 | Jindal | H01L 27/11556 257/315 |
| 2013/0168752 A1* | 7/2013 | Kim | H01L 27/11582 257/314 |
| 2014/0175530 A1* | 6/2014 | Chien | H01L 29/66825 257/321 |
| 2014/0225181 A1* | 8/2014 | Makala | H01L 29/7889 257/321 |
| 2014/0252443 A1* | 9/2014 | Kawai | H01L 27/1157 257/314 |
| 2014/0353738 A1* | 12/2014 | Makala | H01L 27/11551 257/321 |
| 2015/0179662 A1 | 6/2015 | Makala et al. | |
| 2015/0243675 A1* | 8/2015 | Lim | H01L 27/11556 257/324 |
| 2015/0249093 A1* | 9/2015 | Lee | H01L 27/11582 257/324 |
| 2015/0255485 A1* | 9/2015 | Kameoka | H01L 27/11582 257/314 |
| 2015/0255486 A1* | 9/2015 | Kameoka | H01L 27/11582 257/314 |
| 2015/0364488 A1* | 12/2015 | Pachamuthu | H01L 29/665 257/314 |
| 2016/0043093 A1* | 2/2016 | Lee | H01L 27/11521 257/314 |
| 2016/0043100 A1* | 2/2016 | Lee | H01L 27/11565 257/324 |
| 2017/0084618 A1* | 3/2017 | Peri | H01L 27/115 |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, M. "3D Cells Make Terabit NAND Flash Possible," Nikkei Electronics Asia, Sep. 17, 2009, 6pgs.

International Search Report & Written Opinion, PCT/US2011/042566, dated Jan. 17, 2012.

Invitation to Pay Additional Fees & Partial International Search Report, PCT/US2011/042566, dated Sep. 28, 2011.

International Search Report, International Application No. PCT/US2013/035567, dated Sep. 30, 2013, 6pgs.

U.S. Appl. No. 14/687,403, filed Apr. 15, 2015, SanDisk Technologies Inc.

U.S. Appl. No. 14/734,254, filed Jun. 9, 2015, SanDisk Technologies Inc.

* cited by examiner

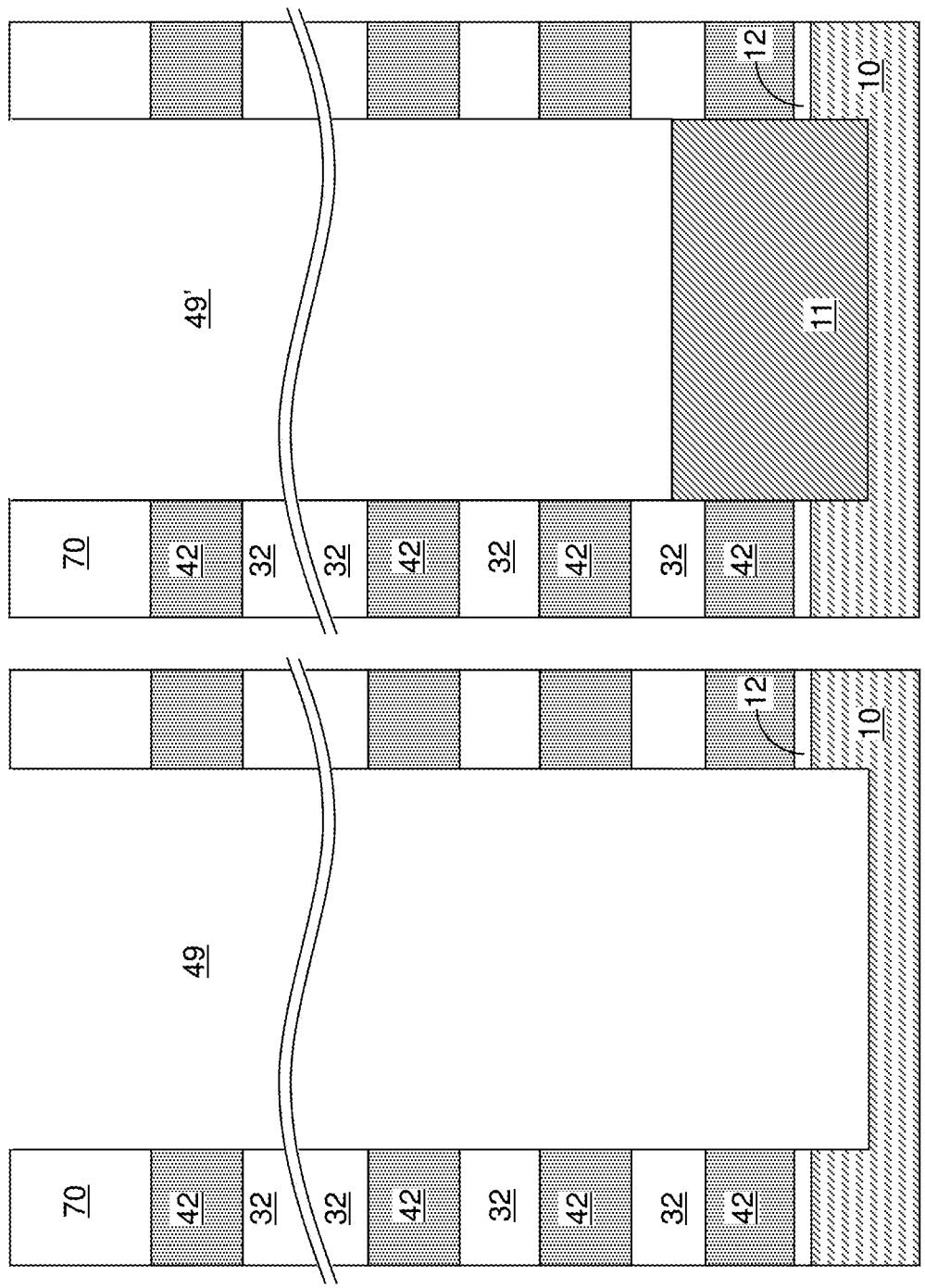

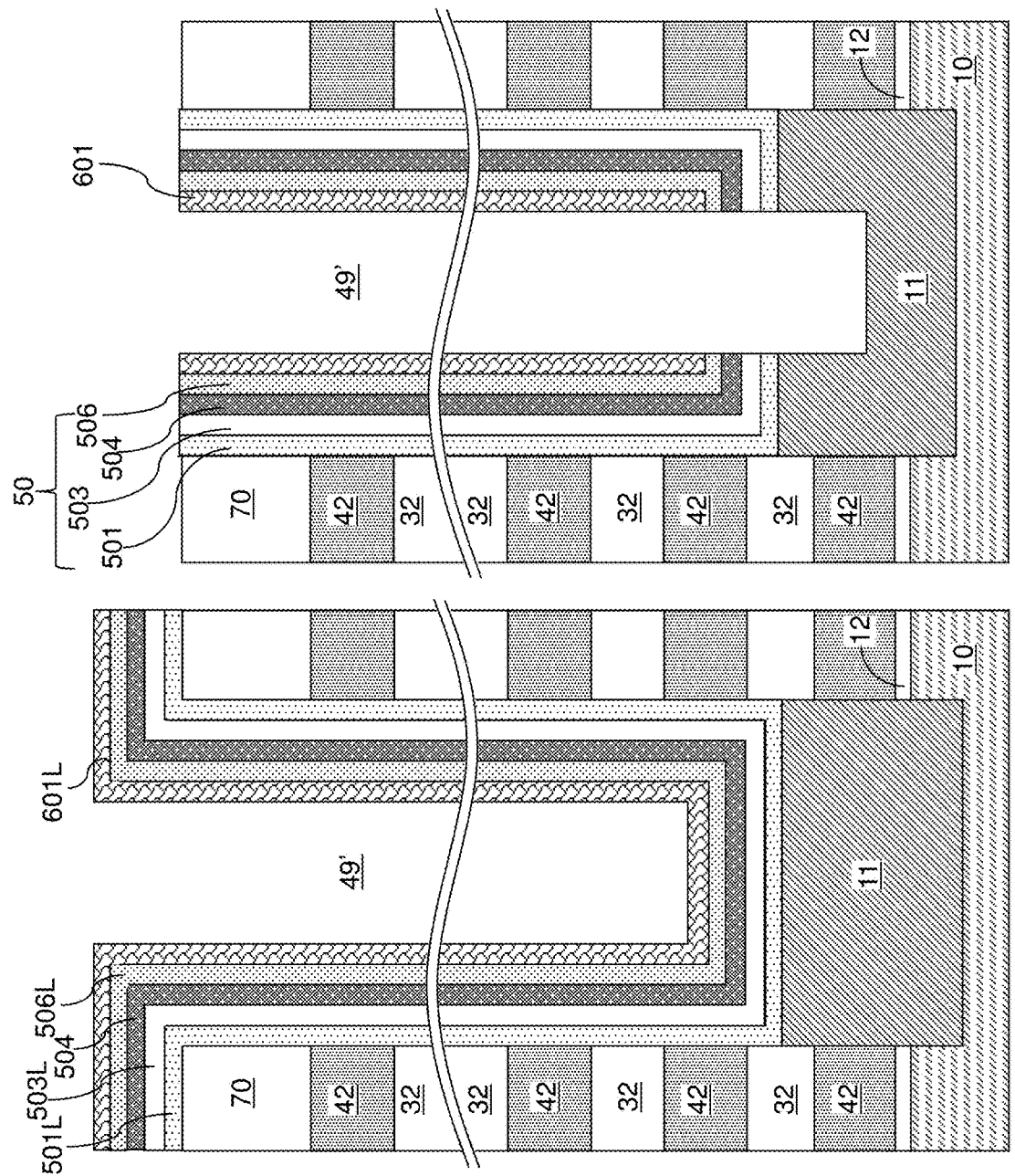

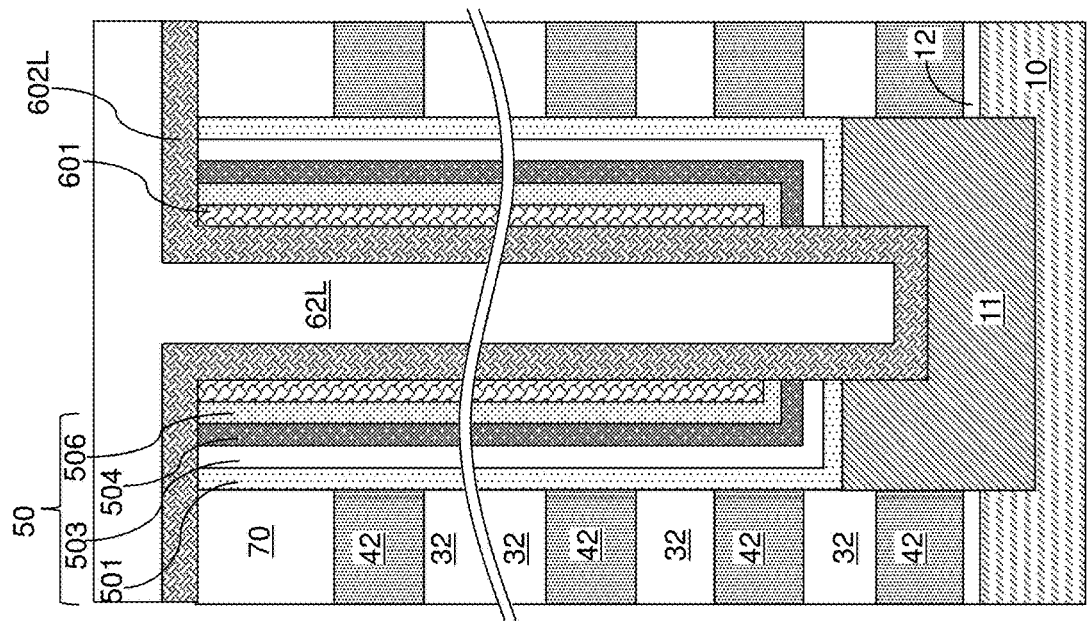
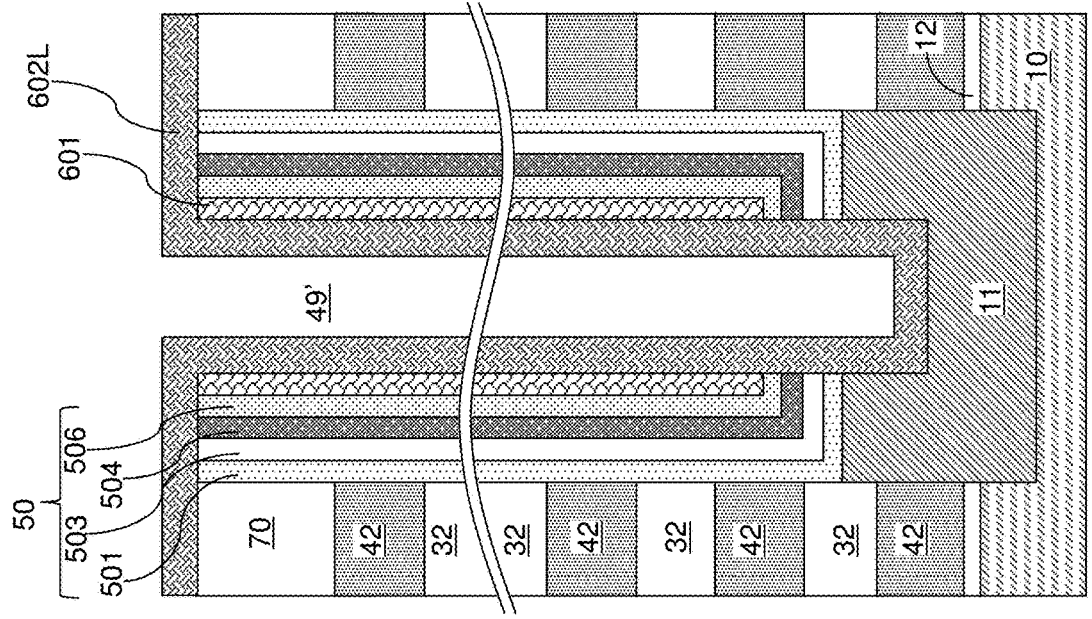

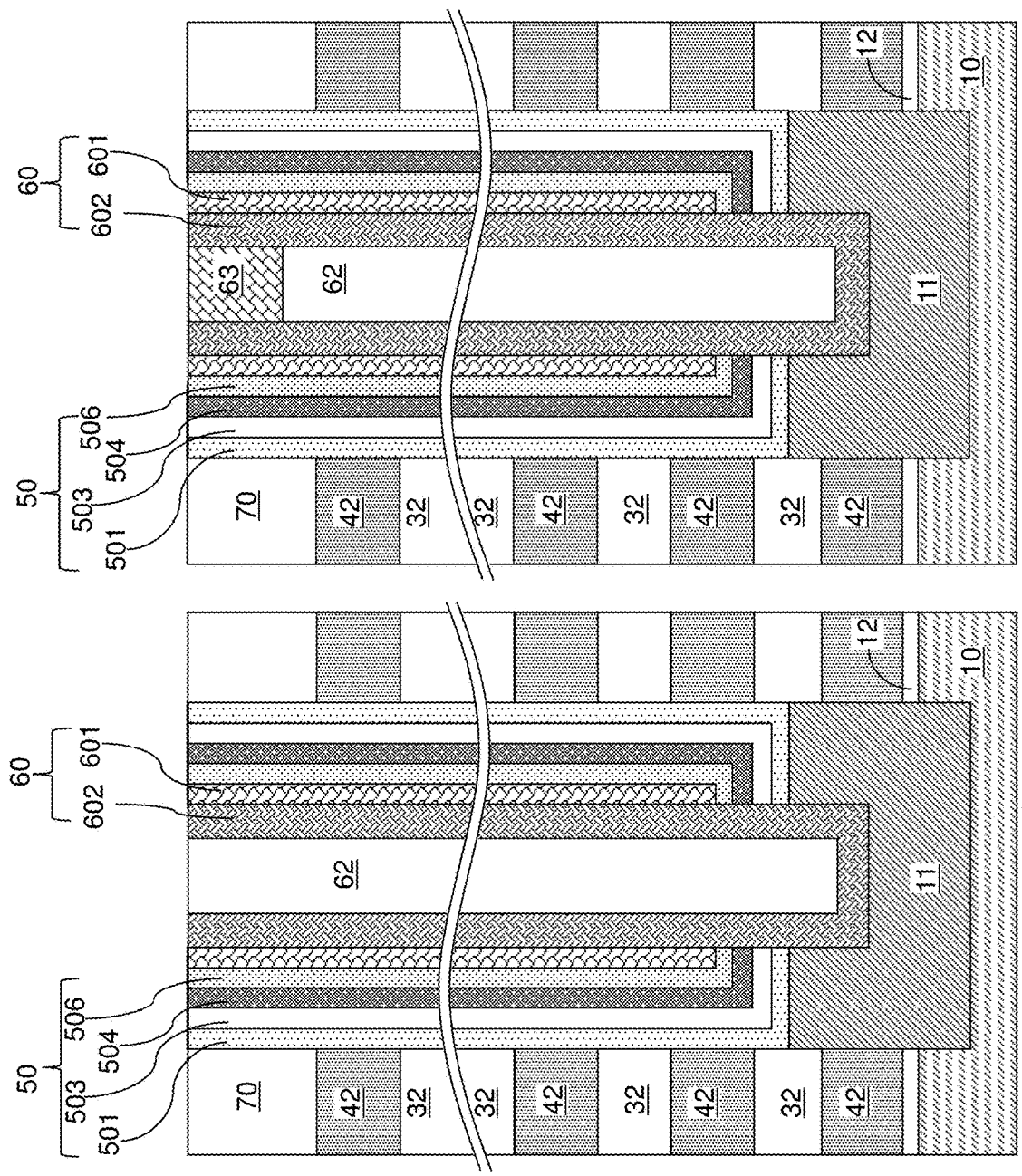

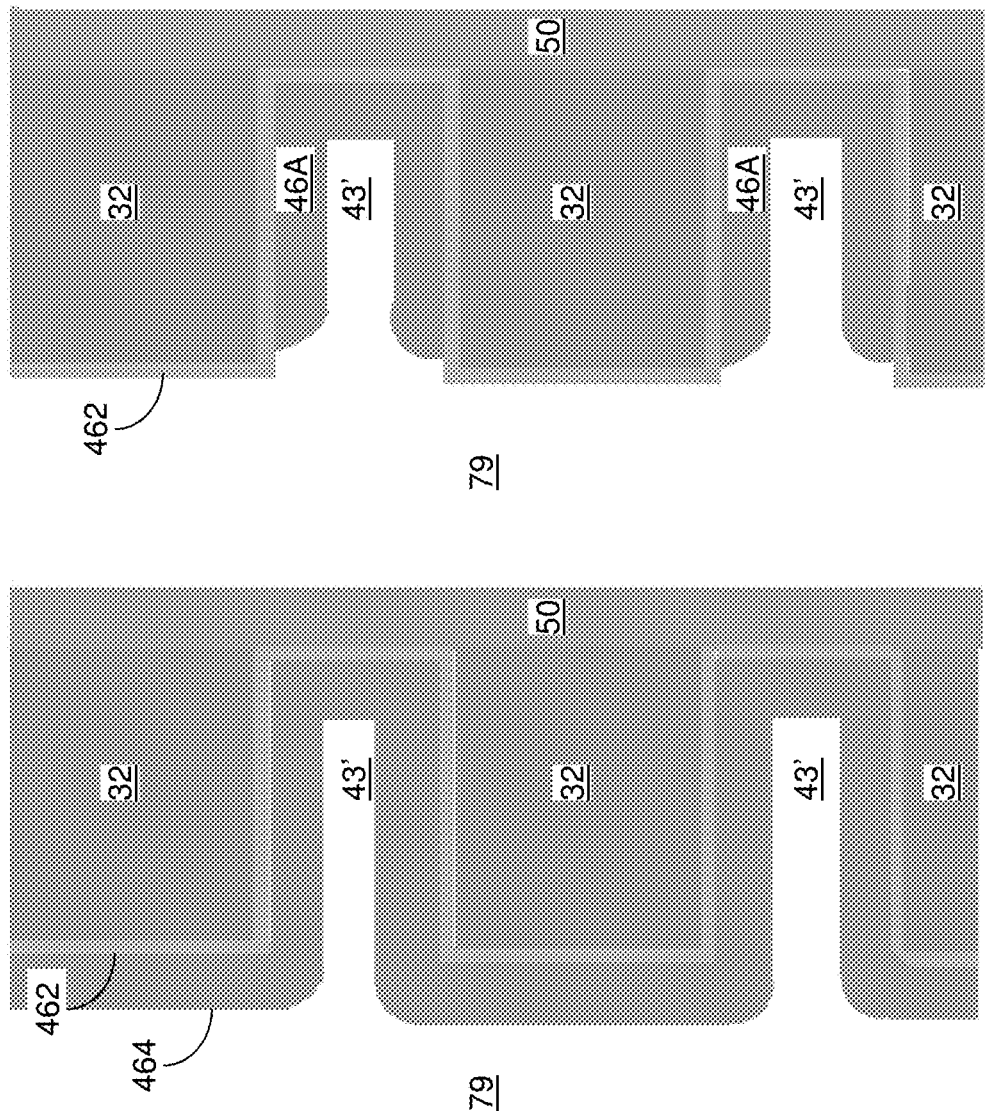

MEMORY DEVICE CONTAINING COBALT SILICIDE CONTROL GATE ELECTRODES AND METHOD OF MAKING THEREOF

FIELD

The present disclosure relates generally to the field of semiconductor devices and specifically to three-dimensional memory structures, such as vertical NAND strings and other three-dimensional devices, and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of manufacturing a three-dimensional memory device is provided. An alternating stack comprising insulating layers and sacrificial material layers is formed over a substrate. Memory stack structures extending through the alternating stack are formed. A backside trench is formed through the alternating stack. Backside recesses are formed around the memory stack structures by removing the sacrificial material layers through the backside trench. A semiconductor material and a metallic material are deposited within each backside recess. A metal-semiconductor alloy material is formed within each backside recess by reacting the semiconductor material and the metallic material in an anneal process. Portions of the metal-semiconductor alloy material are electrically isolated within each backside recess by removing a conductive material from the backside trench. Each remaining portion of the metal-semiconductor alloy material constitutes a portion of an electrically conductive layer.

According to another aspect of the present disclosure, a three-dimensional memory device is provided, which comprises an alternating stack of insulating layers and electrically conductive layers and located over a substrate; and memory stack structures extending through the alternating stack. Each of the electrically conductive layers comprises a metal-semiconductor alloy portion and a metallic liner. The metallic liners laterally separate the metal-semiconductor alloy portions from the memory stack structures, from a respective overlying insulating layer, and from a respective underlying insulating layer. The metal-semiconductor alloy portion contacts a sidewall and two horizontal surfaces of a respective metallic liner.

BRIEF DESCRIPTION OF THE DRAWINGS

FIGS. 2A-2H are sequential vertical cross-sectional views of a memory opening within the exemplary structure during various processing steps employed to form a memory stack structure according to an embodiment of the present disclosure.

FIGS. 8A-8H are sequential vertical cross-sectional views of a magnified region M in FIG. 7 during formation of first exemplary electrically conductive layers according to a first embodiment of the present disclosure.

DETAILED DESCRIPTION

As discussed above, the present disclosure is directed to three-dimensional memory structures, such as vertical NAND strings and other three-dimensional devices, and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, and/or may have one or more layer thereupon, thereabove, and/or therebelow.

Figure 1:
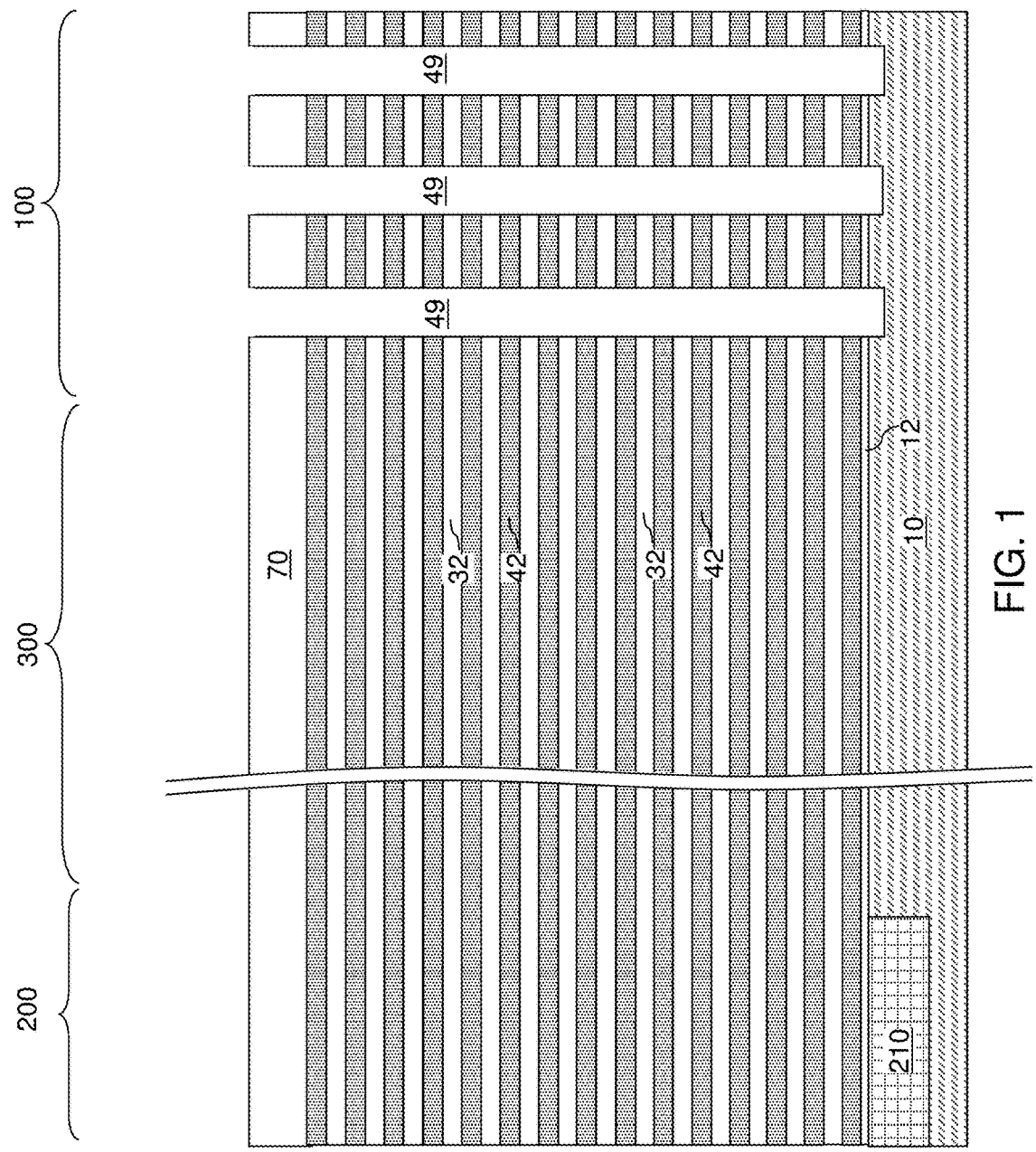
FIG. 1 is a vertical cross-sectional view of an exemplary structure after formation of an alternating stack of insulating layers and sacrificial material layers and memory openings extending through the alternating stack according to an embodiment of the present disclosure.

As used herein, a "field effect transistor" refers to any semiconductor device having a semiconductor channel through which electrical current flows with a current density modulated by an external electrical field. As used herein, an "active region" refers to a source region of a field effect transistor or a drain region of a field effect transistor. A "top active region" refers to an active region of a field effect transistor that is located above another active region of the field effect transistor. A "bottom active region" refers to an active region of a field effect transistor that is located below another active region of the field effect transistor. A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein. Referring to FIG. 1, an exemplary structure according to an embodiment of the present disclosure is illustrated, which can be employed, for example, to fabricate a device structure containing vertical NAND memory devices. The exemplary structure includes a substrate, which can be a semiconductor substrate (e.g., a semiconductor substrate, such as a single crystalline silicon wafer). The substrate can include a semiconductor substrate layer 10. The semiconductor substrate layer 10 is a semiconductor material layer, and can include at least one elemental semiconductor material (e.g., silicon, such as single crystalline silicon), at least one III-V compound semiconductor material, at least one II-VI compound semiconductor material, at least one organic semiconductor material, or other semiconductor materials known in the art.

As used herein, a "semiconductor material" refers to a material having electrical conductivity in the range from $1.0\times10^{-6}$ S/cm to $1.0\times10^{5}$ S/cm, and is capable of producing a doped material having electrical conductivity in a range from 1.0 S/cm to $1.0\times10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^{5}$ S/cm. As used herein, an "insulating material" or a "dielectric material" refers to a material having electrical conductivity less than $1.0\times10^{-6}$ S/cm. All measurements for electrical conductivities are made at the standard condition. The semiconductor substrate layer 10 can include at least one doped well (not expressly shown) having a substantially uniform dopant concentration therein.

The exemplary structure can have multiple regions for building different types of devices. Such areas can include, for example, a device region 100, a contact region 300, and a peripheral device region 200. In one embodiment, the semiconductor substrate layer 10 can include at least one a doped well in the device region 100. As used herein, a "doped well" refers to a portion of a semiconductor material having a doping of a same conductivity type (which can be p-type or n-type) and a substantially same level of dopant concentration throughout. The doped well can be the same as the semiconductor substrate layer 10 or can be a portion of the semiconductor substrate layer 10. The conductivity type of the doped well is herein referred to as a first conductivity type, which can be p-type or n-type. The dopant concentration level of the doped well is herein referred to as a first dopant concentration level. In one embodiment, the first dopant concentration level can be in a range from $1.0\times10^{15}$/cm$^3$ to $1.0\times10^{18}$/cm$^3$, although lesser and greater dopant concentration levels can also be employed. As used herein, a dopant concentration level refers to average dopant concentration for a given region.

Peripheral devices 210 can be formed in, or on, a portion of the semiconductor substrate layer 10 located within the peripheral device region 200. The peripheral devices can include various devices employed to operate the memory devices to be formed in the device region 100, and can include, for example, driver circuits for the various components of the memory devices. The peripheral devices 210 can include, for example, field effect transistors and/or passive components such as resistors, capacitors, inductors, diodes, etc.

Optionally, a gate dielectric layer 12 can be formed above the semiconductor substrate layer 10. The gate dielectric layer 12 can be employed as the gate dielectric for a first source select gate electrode. The gate dielectric layer 12 can include, for example, silicon oxide and/or a dielectric metal oxide (such as HfO$_2$, ZrO$_2$, LaO$_2$, etc.). The thickness of the gate dielectric layer 12 can be in a range from 3 nm to 30 nm, although lesser and greater thicknesses can also be employed.

An alternating stack of first material layers (which can be insulating layers 32) and second material layers (which are referred to spacer material layers) is formed over the top surface of the substrate, which can be, for example, on the top surface of the gate dielectric layer 12. As used herein, a "material layer" refers to a layer including a material throughout the entirety thereof. As used herein, a "spacer material layer" refers to a material layer that is located between two other material layers, i.e., between an overlying material layer and an underlying material layer. The spacer material layers can be formed as electrically conductive layers, or can be replaced with electrically conductive layers in a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer 42. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the top surface of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

A lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form first memory openings 49. In other words, the transfer of the pattern in the patterned lithographic material stack through the alternating stack (32, 42) forms the first memory openings that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the gate dielectric layer 12 may be used as an etch stop layer between the alternating stack (32, 42) and the substrate. The sidewalls of the first memory openings can be substantially vertical, or can be tapered. The patterned lithographic material stack can be subsequently removed, for example, by ashing.

A memory stack structure can be formed in each of the memory opening. FIGS. 2A-2H illustrate sequential vertical cross-sectional views of a memory opening during formation of an exemplary memory stack structure. Formation of the exemplary memory stack structure can be performed within each of the memory openings 49 in the exemplary structure illustrated in FIG. 1.

Referring to FIG. 2A, a memory opening 49 is illustrated. The memory opening 49 extends through the insulating cap layer 70, the alternating stack (32, 42), and the gate dielectric layer 12, and optionally into an upper portion of the semiconductor substrate layer 10. The recess depth of the bottom surface of each memory opening 49 with respect to the top surface of the semiconductor substrate layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an epitaxial channel portion 11 can be optionally formed at the bottom of each memory opening 49 by selective epitaxy of a semiconductor material. During the selective epitaxy process, a reactant gas and an etchant gas can be simultaneously or alternatively flowed into a process chamber. Semiconductor surfaces and dielectric surfaces of the exemplary structure provide different nucleation rates for the semiconductor material. By setting the etch rate (determined by the flow of the etchant gas) of the semiconductor material greater than the nucleation rate of the semiconductor material on the dielectric surfaces and less than the nucleation rate of the semiconductor material on the semiconductor surfaces, the semiconductor material can grow from the physically exposed semiconductor surfaces (i.e., from the physically exposed surfaces of the semiconductor substrate layer 10 at the bottom of each memory opening 49). Each portion of the deposited semiconductor material constitutes an epitaxial channel portion 11, which comprises a single crystalline semiconductor material (e.g., single crystalline silicon) in epitaxial alignment with the single crystalline semiconductor material (e.g., single crystalline silicon) of the semiconductor substrate layer 10. Each epitaxial channel portion 11 functions as a portion of a channel of a vertical field effect transistor. The top surface of the epitaxial channel portion 11 can be between a pair of sacrificial material layers 42. In other words, a periphery of each epitaxial channel portion 11 can be in physical contact with a sidewall of an insulating layer 32. A cavity 49' is present over an epitaxial channel portion 11 in each memory opening 49.

Referring to FIG. 2C, a series of layers including at least one blocking dielectric layer (501L, 503L), a continuous memory material layer 504, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

In an illustrative example, the first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least one oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

The continuous memory material layer 504, the tunneling dielectric layer 506L, and the optional first semiconductor channel layer 601L can be sequentially formed. In one embodiment, the continuous memory material layer 504 can be a charge trapping material including a dielectric charge trapping material, which can be, for example, silicon nitride. Alternatively, the continuous memory material layer 504 can include a conductive material such as doped polysilicon or a metallic material that is patterned into multiple electrically isolated portions (e.g., floating gates), for example, by being formed within lateral recesses into sacrificial material layers 42. In one embodiment, the continuous memory material layer 504 includes a silicon nitride layer.

The continuous memory material layer 504 can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the continuous memory material layer 504 may comprise an insulating charge trapping material, such as one or more silicon nitride segments. Alternatively, the continuous memory material layer 504 may comprise conductive nanoparticles such as metal nanoparticles, which can be, for example, ruthenium nanoparticles. The continuous memory material layer 504 can be formed, for example, by chemical vapor deposition (CVD), atomic layer deposition (ALD), physical vapor deposition (PVD), or any suitable deposition technique for storing electrical charges therein. The thickness of the continuous memory material layer 504 can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506L, 601L).

Referring to FIG. 2D, the optional first semiconductor channel layer 601L, the tunneling dielectric layer 506L, the continuous memory material layer 504, the at least one blocking dielectric layer (501L, 503L) are sequentially anisotropically etched employing at least one anisotropic etch process. The portions of the first semiconductor channel layer 601L, the tunneling dielectric layer 506L, the continuous memory material layer 504, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the continuous memory material layer 504, and the at least one blocking dielectric layer (501L, 503L) at a bottom of each cavity 49' can be removed to form openings in remaining portions thereof. Each of the first semiconductor channel layer 601L, the tunneling dielectric layer 506L, the continuous memory material layer 504, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the continuous memory material layer 504 is herein referred to as a memory material layer 504. The memory material layer 504 can comprise a charge trapping material or a floating gate material. In one embodiment, each memory material layer 504 can include a vertical stack of charge storage regions that store electrical charges upon programming. In one embodiment, the memory material layer 504 can be a charge storage layer in which each portion adjacent to the sacrificial material layers 42 constitutes a charge storage region. Each remaining portion of the second blocking dielectric layer 503L is herein referred to as a second blocking dielectric 503. Each remaining portion of the first blocking dielectric layer 501L is herein referred to as a first blocking dielectric 501.

A surface of the epitaxial channel portion 11 (or a surface of the semiconductor substrate layer 10 in case the epitaxial channel portions 11 are not employed) can be physically exposed underneath the opening through the first semiconductor channel portion 601, the tunneling dielectric 506, the memory material layer 504, and the at least one blocking dielectric (501, 503). Optionally, the physically exposed semiconductor surface at the bottom of each cavity 49' can be vertically recessed so that the recessed semiconductor surface underneath the cavity 49' is vertically offset from the topmost surface of the epitaxial channel portion 11 (or of the semiconductor substrate layer 10 in case epitaxial channel portions 11 are not employed) by a recess distance. A tunneling dielectric 506 is located over the memory material layer 504. A set of at least one blocking dielectric (501, 503), a memory material layer 504, and a tunneling dielectric 506 in a memory opening 49 constitutes a memory film 50, which includes a plurality of charge storage regions (as embodied as the memory material layer 504) that are insulated from surrounding materials by the at least one blocking dielectric (501, 503) and the tunneling dielectric 506.

In one embodiment, the first semiconductor channel portion 601, the tunneling dielectric 506, the memory material layer 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 or the semiconductor substrate layer 10 if portion 11 is omitted, and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 2G, the horizontal portion of the dielectric core layer 62L can be removed, for example, by a recess etch from above the top surface of the insulating cap layer 70. Each remaining portion of the dielectric core layer 62L constitutes a dielectric core 62. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a memory material layer 504, and laterally surrounds a portion of the semiconductor channel 60. Each adjoining set of a first blocking dielectric 501, a second blocking dielectric 503, a memory material layer 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

Referring to FIG. 2H, the top surface of each dielectric core 62 can be further recessed within each memory opening, for example, by a recess etch to a depth that is located between the top surface of the insulating cap layer 70 and the bottom surface of the insulating cap layer 70. Drain regions 63 can be formed by depositing a doped semiconductor material within each recessed region above the dielectric cores 62. The doped semiconductor material can be, for example, doped polysilicon. Excess portions of the deposited semiconductor material can be removed from above the top surface of the insulating cap layer 70, for example, by chemical mechanical planarization (CMP) or a recess etch to form the drain regions 63.

Figure 3:
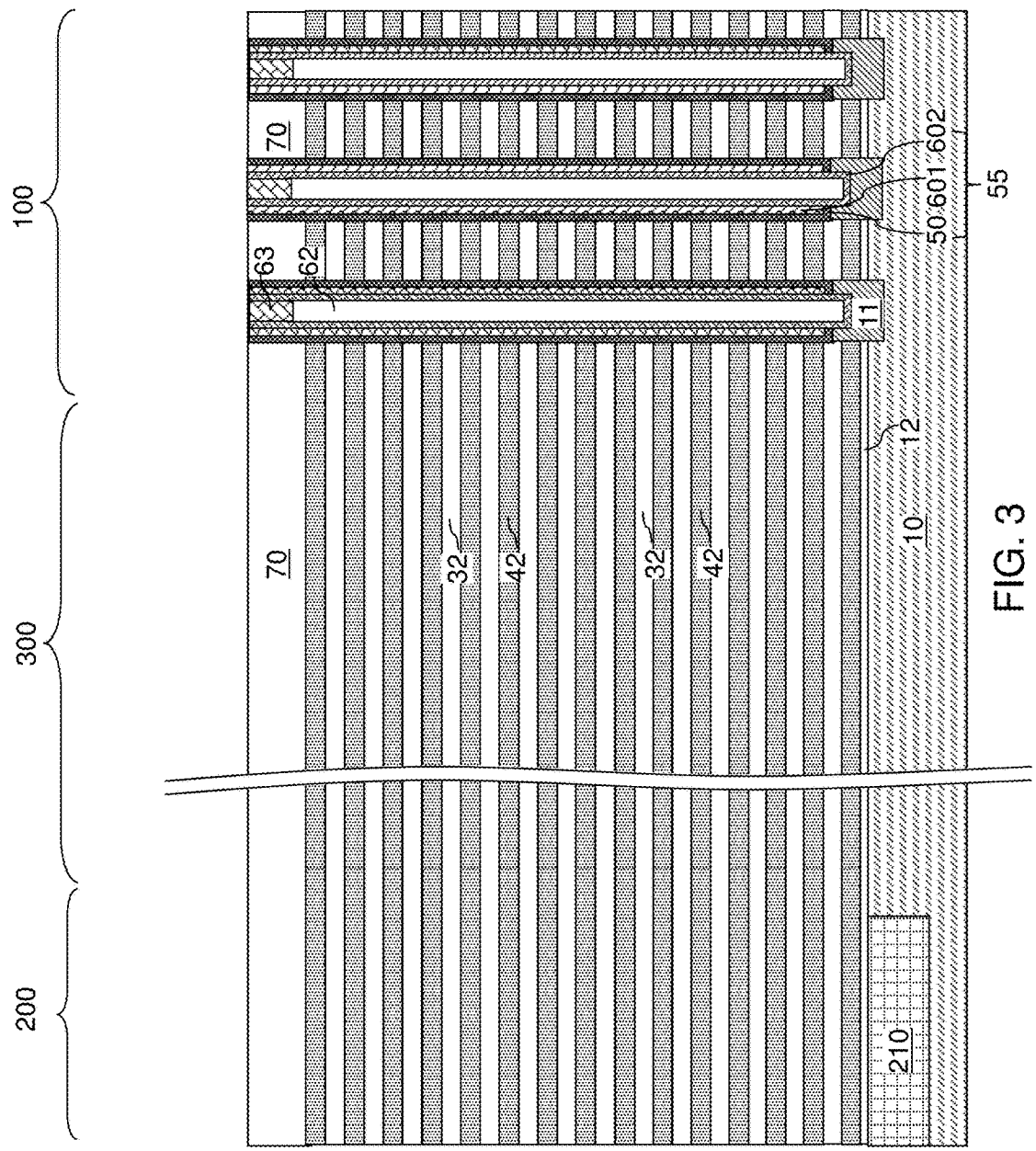
FIG. 3 is a vertical cross-sectional view of the exemplary structure after formation of memory stack structures according to an embodiment of the present disclosure.

The exemplary memory stack structure 55 can be embedded into the exemplary structure illustrated in FIG. 1. FIG. 3 illustrates the exemplary structure that incorporates multiple instances of the exemplary memory stack structure of FIG. 2H. Each exemplary memory stack structure 55 includes a semiconductor channel (601, 602); a tunneling dielectric layer 506 laterally surrounding the semiconductor channel (601, 602); and a vertical stack of charge storage regions laterally surrounding the tunneling dielectric layer 506 (as embodied as a memory material layer 504). The exemplary structure includes a semiconductor device, which comprises a stack (32, 42) including an alternating plurality of material layers (e.g., the sacrificial material layers 42) and insulating layers 32 located over a semiconductor substrate (e.g., over the semiconductor substrate layer 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
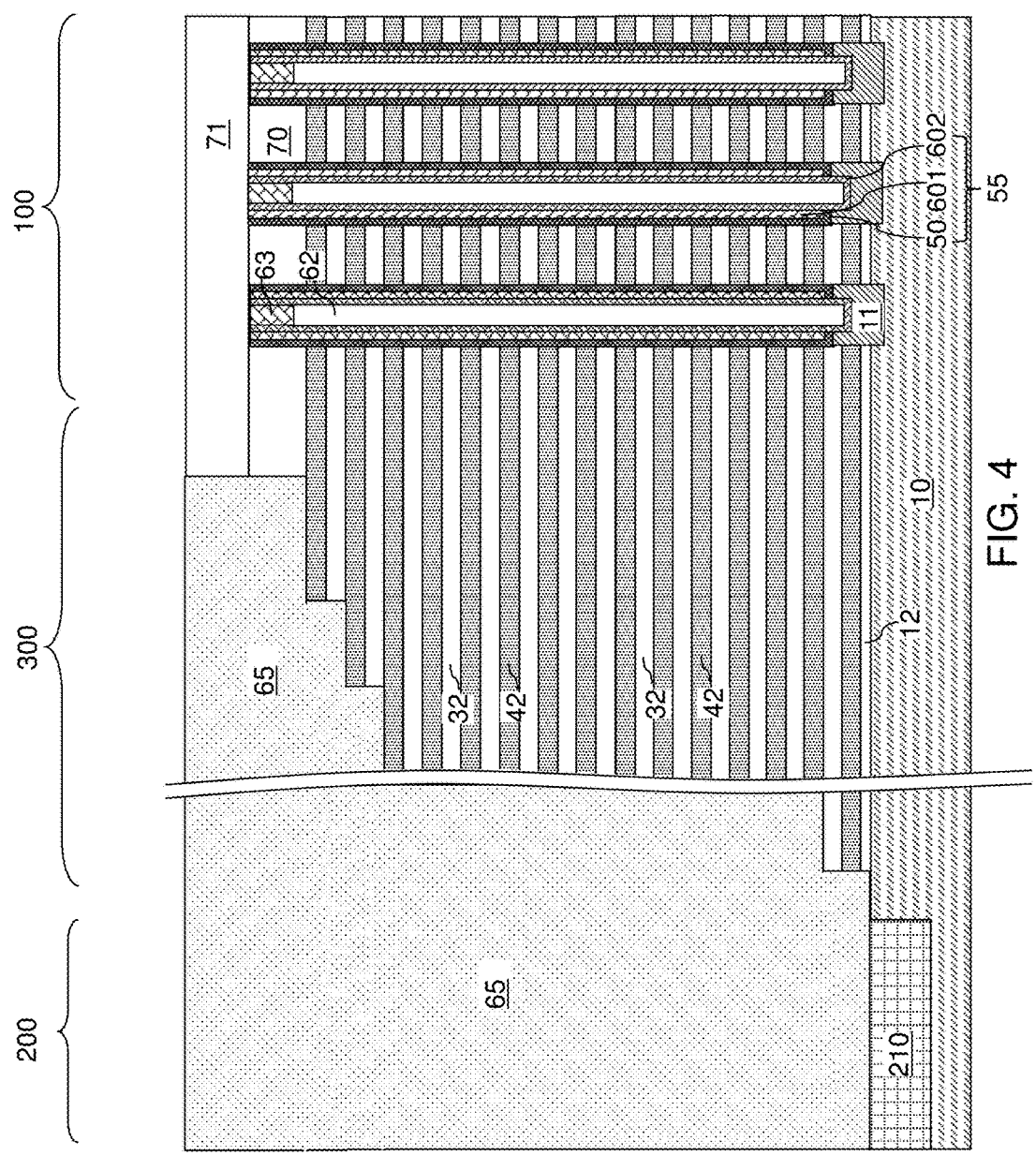
FIG. 4 is a vertical cross-sectional view of the exemplary structure after formation of a set of stepped surfaces and a retro-stepped dielectric material portion according to an embodiment of the present disclosure.

Referring to FIG. 4, an optional first contact level dielectric layer 71 can be formed over the semiconductor substrate layer 10. As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

In one embodiment, the first contact level dielectric layer 71, the insulating cap layer 70, and the alternating stack (32, 42) can be removed from the peripheral device region 200, for example, by a masked etch process. In addition, a stepped cavity can be formed within the contact region 300 by patterning a portion of the alternating stack (32, 42). As used herein, a "stepped cavity" refers to a cavity having stepped surfaces. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "step" refers to a vertical shift in the height of a set of adjoined surfaces.

The stepped cavity can have various stepped surfaces such that the horizontal cross-sectional shape of the stepped cavity changes in steps as a function of the vertical distance from the top surface of the semiconductor substrate layer 10. In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating stack is defined as the relative position of a pair of a first material layer and a second material layer within the structure. After formation of all stepped surfaces, mask material layers employed to form the stepped surfaces can be removed, for example, by ashing. Multiple photoresist layers and/or multiple etch processes can be employed to form the stepped surfaces.

A dielectric material such as silicon oxide is deposited in the stepped cavity and over the peripheral devices 210 in the peripheral device region 200. Excess portions of the deposited dielectric material can be removed from above the top surface of the first contact level dielectric layer 71, for example, by chemical mechanical planarization (CMP). The remaining portion of the deposited dielectric material filling the stepped cavity in the contact region 300 and overlying the semiconductor substrate layer 10 in the peripheral device region 200 constitutes a retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed as the dielectric material, the silicon oxide of the retro-stepped dielectric material portion 65 may, or may not, be doped with dopants such as B, P, and/or F. The top surface of the retro-stepped dielectric material portion 65 can be coplanar with the top surface of the first contact level dielectric layer 71.

The region over the peripheral devices 210 and the region over the stepped cavities can be filled simultaneously with the same dielectric material, or can be filled in different processing steps with the same dielectric material or with different dielectric materials. The cavity over the peripheral devices 210 can be filled with a dielectric material prior to, simultaneously with, or after, filling of the cavity over the stepped surface of the contact region 300 with a dielectric material. While the present disclosure is described employing an embodiment in which the cavity in the peripheral device region 200 and the stepped cavity in the contact region 300 are filled simultaneously, embodiments are expressly contemplated herein in which the cavity in the peripheral device region 200 and the stepped cavity in the contact region 300 are filled in different processing steps.

Figure 5:
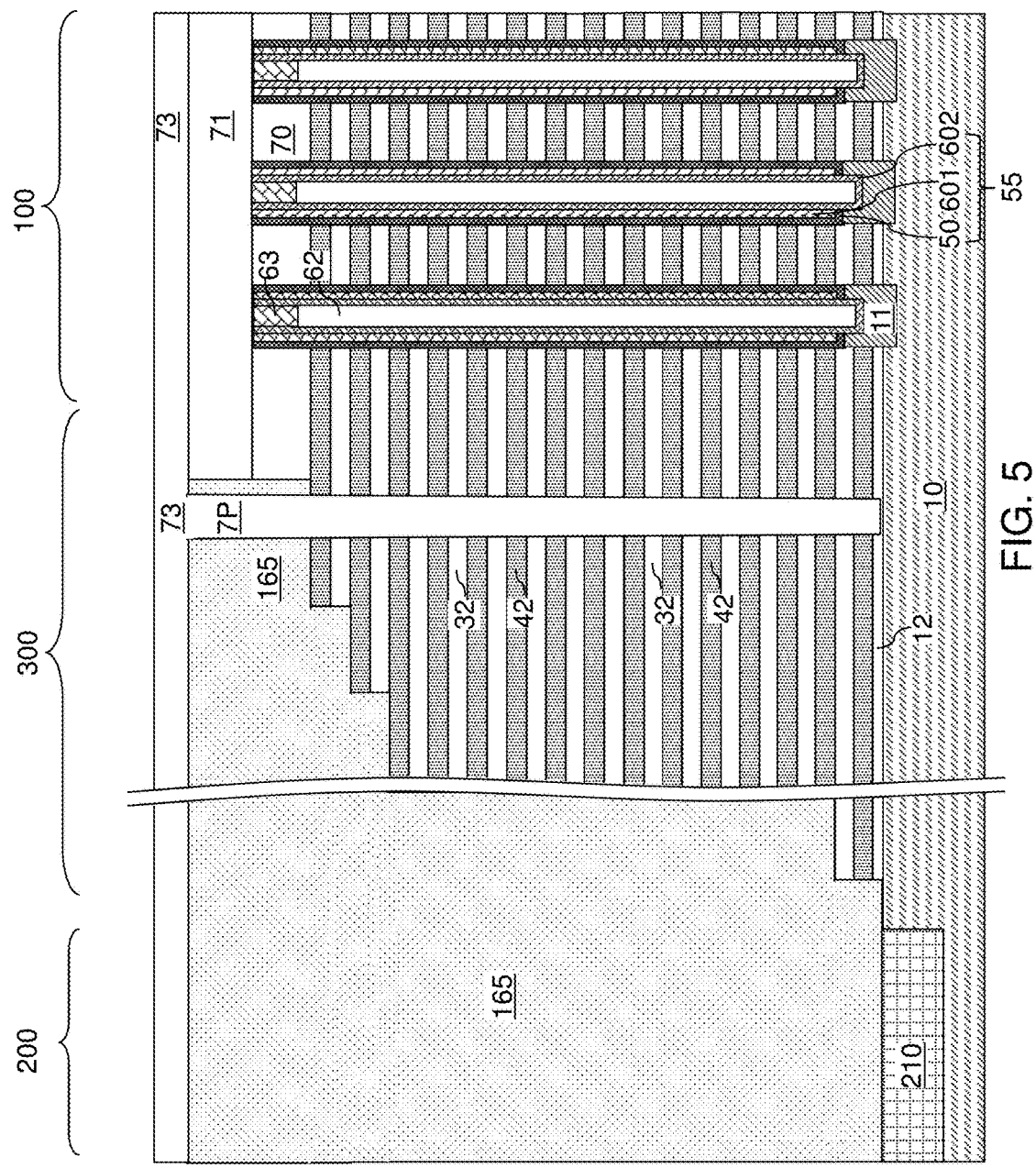
FIG. 5 is a vertical cross-sectional view of the exemplary structure after formation of dielectric pillar structures according to an embodiment of the present disclosure.

Referring to FIG. 5, dielectric support pillars 7P may be optionally formed through the retro-stepped dielectric material portion 65 and/or through the first contact level dielectric layer 71 and/or through the alternating stack (32, 42). In one embodiment, the dielectric support pillars 7P can be formed in the contact region 300, which is located adjacent to the device region 100. The dielectric support pillars 7P can be formed, for example, by forming an opening extending through the retro-stepped dielectric material portion 65 and/or through the alternating stack (32, 42) and at least to the top surface of the semiconductor substrate layer 10, and by filling the opening with a dielectric material that is resistant to the etch chemistry to be employed to remove the sacrificial material layers 42.

In one embodiment, the dielectric support pillars 7P can include silicon oxide and/or a dielectric metal oxide such as aluminum oxide. In one embodiment, the portion of the dielectric material that is deposited over the first contact level dielectric layer 71 concurrently with deposition of the dielectric support pillars 7P can be present over the first contact level dielectric layer 71 as a second contact level dielectric layer 73. Each of the dielectric support pillars 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a first source contact via structure.

The second contact level dielectric layer 73 and the dielectric support pillars 7P can be formed as a single continuous structure of integral construction, i.e., without any material interface therebetween. In another embodiment, the portion of the dielectric material that is deposited over the first contact level dielectric layer 71 concurrently with deposition of the dielectric support pillars 7P can be removed, for example, by chemical mechanical planarization or a recess etch. In this case, the second contact level dielectric layer 73 is not present, and the top surface of the first contact level dielectric layer 71 can be physically exposed.

Figure 6A:
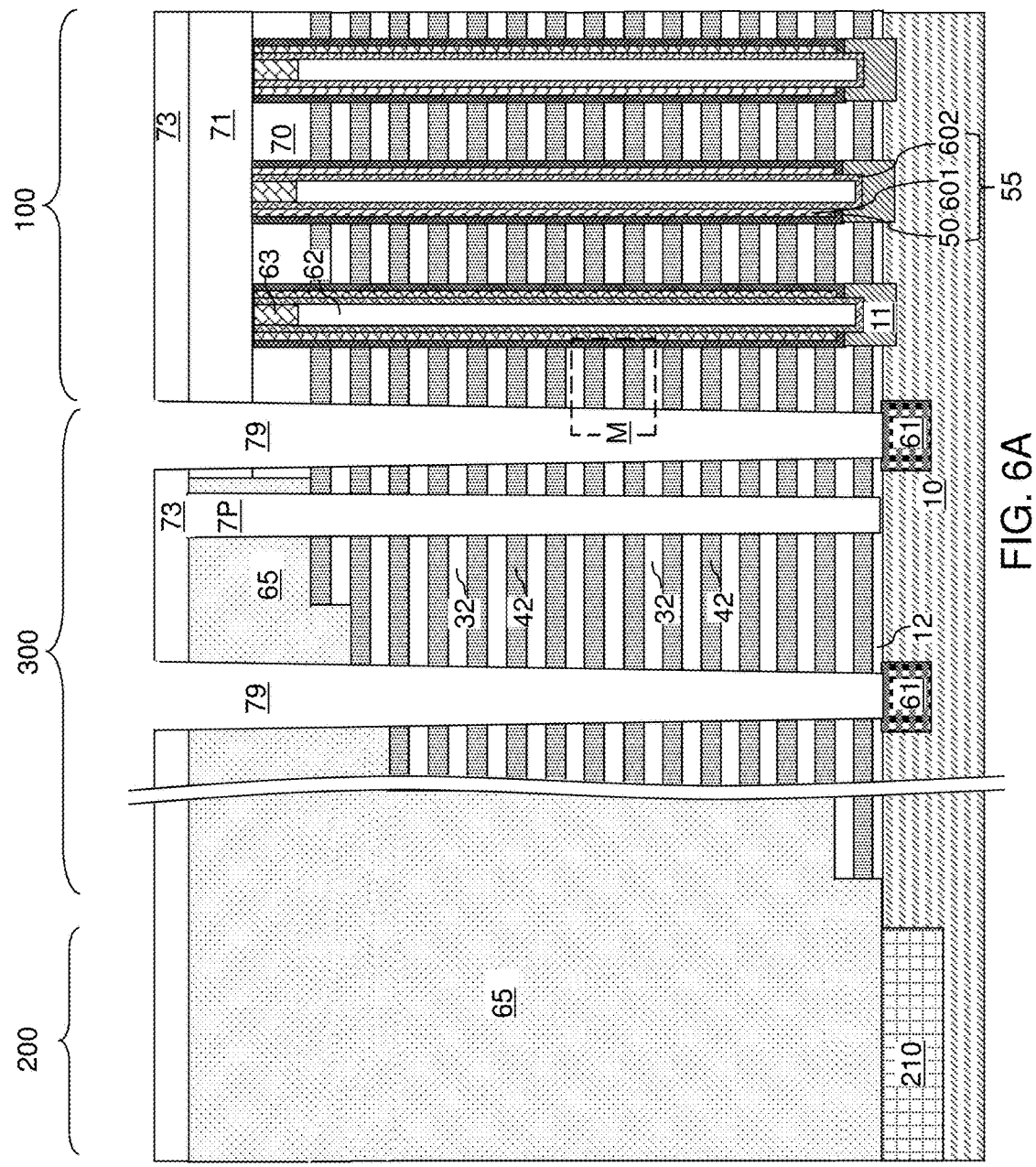
FIG. 6A is a vertical cross-sectional view of the exemplary structure after formation of backside trenches according to an embodiment of the present disclosure.
Figure 6B:
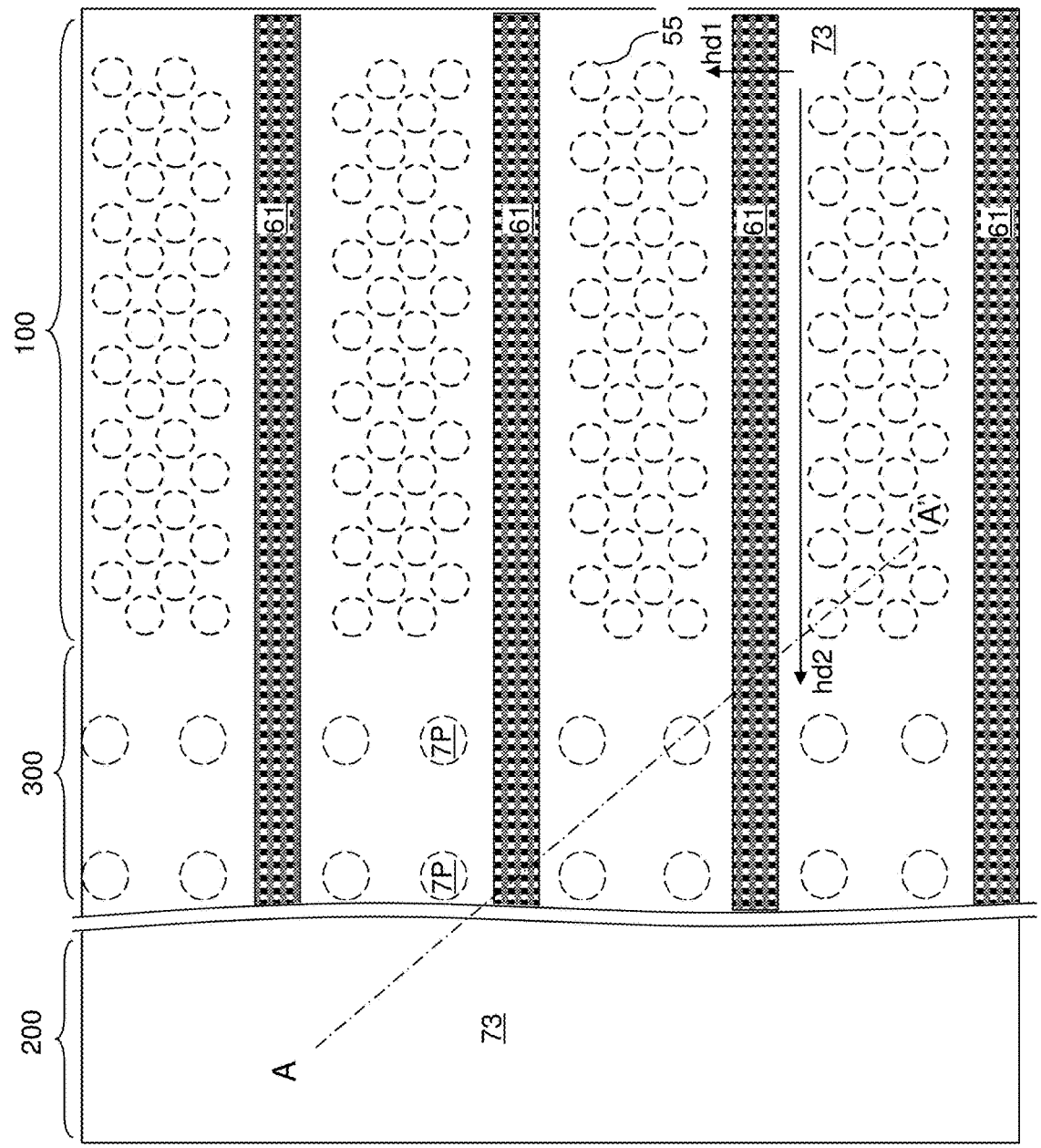
FIG. 6B is a see-through top-down view of the exemplary structure of FIG. 6A. The vertical plane A-A' is the plane of the vertical cross-sectional view of FIG. 6A.

Referring to FIGS. 6A and 6B, a photoresist layer (not shown) can be applied over the at least one contact level dielectric layer (71, 73), and can be lithographically patterned to form openings within areas between the memory blocks. In one embodiment, the memory blocks can be laterally spaced from one another along a first horizontal direction hd1 (e.g., bit line direction), and the dimension of each opening in the photoresist layer along the first horizontal direction hd1 can be less than the spacing between neighboring clusters (i.e., sets) of the memory stack structures 55 along the second horizontal direction hd2 (e.g., word line direction). Further, the dimension of each opening in the photoresist layer along a second horizontal direction hd2 (which is parallel to the lengthwise direction of each cluster of memory stack structures 55) can be greater than the extent of each cluster of the memory stack structures 55 along the first horizontal direction hd1.

Backside trenches 79 can be formed between each neighboring pair of clusters of the memory stack structures 55 by transferring the pattern of the openings in the photoresist layer through the at least one contact level dielectric layer (71, 73), the retro-stepped dielectric material portion 65, and the alternating stack (32, 42). A top surface of the semiconductor substrate layer 10 can be physically exposed at the bottom of each backside trench 79. In one embodiment, each backside trench 79 can extend along the second horizontal direction hd2 so that clusters of the memory stack structures 55 are laterally spaced along the first horizontal direction hd1. Each cluster of memory stack structures 55 in conjunction with the portions of the alternating stack (32, 42) that surround the cluster constitutes a memory block. Each memory block is laterally spaced from one another by the backside trenches 79.

In one embodiment, source regions 61 can be formed in, or on, portions of the semiconductor substrate layer 10 underlying the backside trenches 79 by implantation of dopants of a second conductivity type (which is the opposite of the first conductivity type) after formation of the backside trenches 79. For example, if the first conductivity type is p-type, the second conductivity type is n-type, and vice versa.

Figure 7:
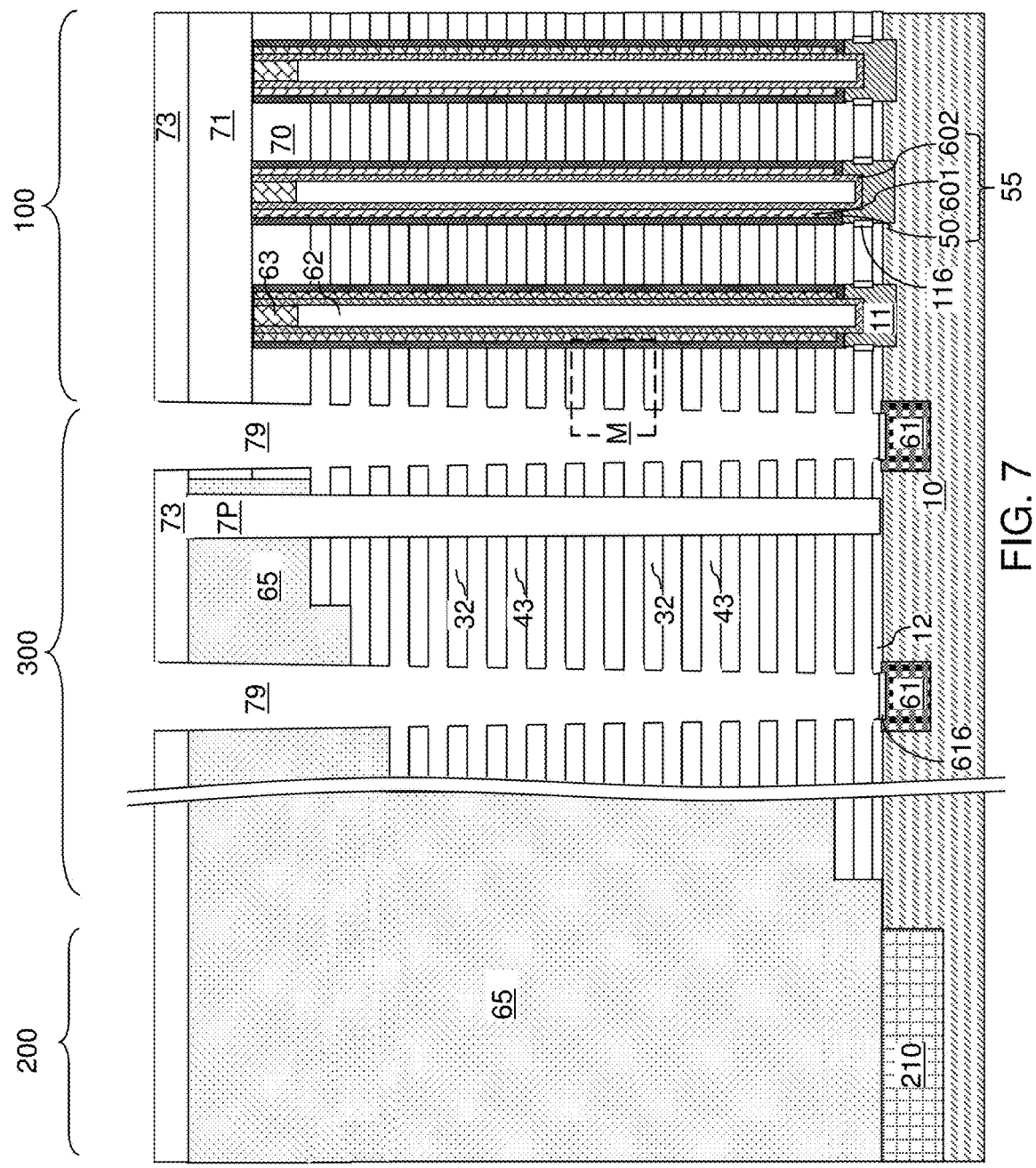
FIG. 7 is a vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 can be introduced into the backside trenches 79, for example, employing an etch process. Backside recesses 43 are formed in volumes from which the sacrificial material layers 42 are removed. The removal of the second material of the sacrificial material layers 42 can be selective to the first material of the insulating layers 32, the material of the dielectric support pillars 7P, the material of the retro-stepped dielectric material portion 65, the semiconductor material of the semiconductor substrate layer 10, and the material of the outermost layer of the first memory films 50. In one embodiment, the sacrificial material layers 42 can include silicon nitride, and the materials of the insulating layers 32, the dielectric support pillars 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the dielectric support pillars 7P, and the retro-stepped dielectric material portion 65 can be selected from silicon oxide, silicon nitride, and dielectric metal oxides. In this case, the depth of the backside trenches 79 can be modified so that the bottommost surface of the backside trenches 79 is located within the gate dielectric layer 12, i.e., to avoid physical exposure of the top surface of the semiconductor substrate layer 10.

The etch process that removes the second material selective to the first material and the outermost layer of the first memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the exemplary structure is immersed within a wet etch tank including phosphoric acid, which etches silicon nitride selective to silicon oxide, silicon, and various other materials employed in the art. The dielectric support pillars 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The first memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (e.g., above the semiconductor substrate layer 10). In this case, each backside recess 43 can define a space for receiving a respective word line of the array of monolithic three-dimensional NAND strings.

Each of the plurality of backside recesses 43 can extend substantially parallel to the top surface of the semiconductor substrate layer 10. A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Subsequently, physically exposed surface portions of epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

A backside blocking dielectric layer (not shown) can be optionally formed. The backside blocking dielectric layer, if present, comprises a dielectric material that functions as a control gate dielectric for the control gates to be subsequently formed in the backside recesses 43. In case at least one blocking dielectric is present within each memory stack structure 55, the backside blocking dielectric layer is optional. In case a blocking dielectric is not present in the memory stack structures 55, the backside blocking dielectric layer is present.

Figure 8B:
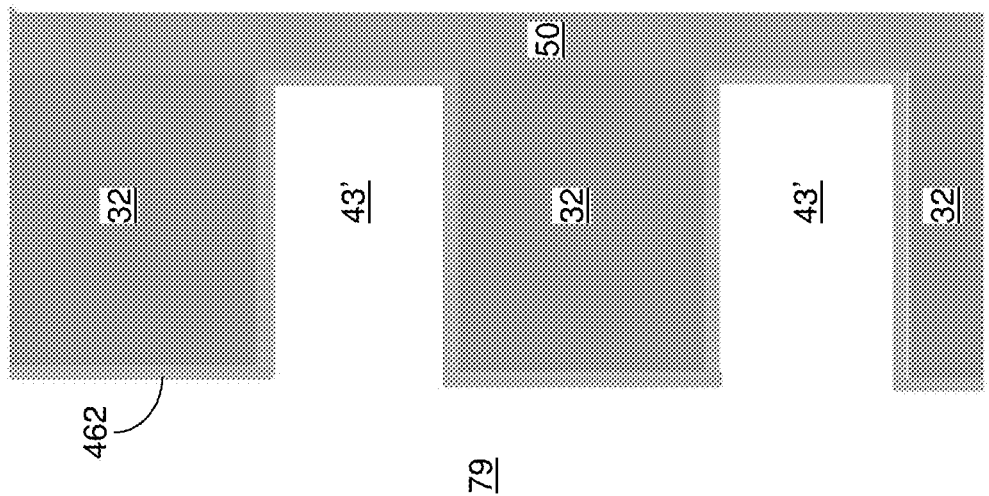
Figure 8A:
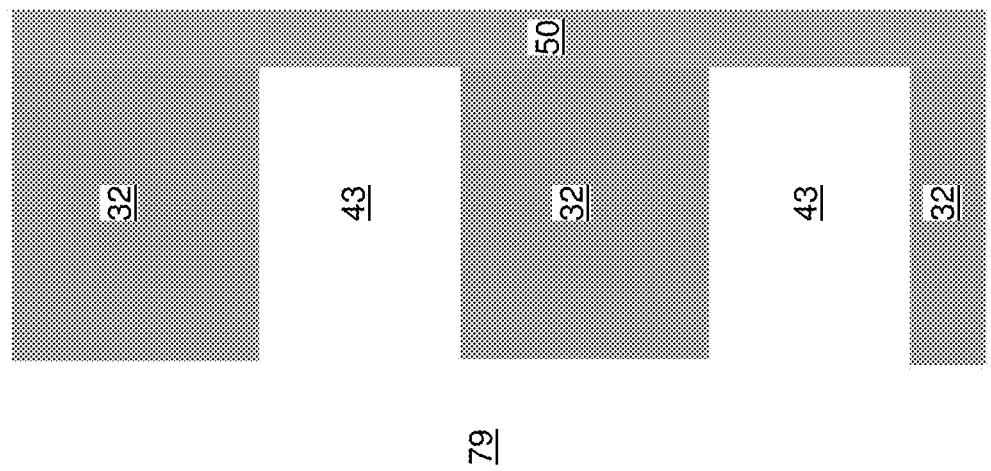

FIGS. 8A-8H illustrate steps in a method of making a device according to a first embodiment of the disclosure. Referring to FIG. 8A, a vertical cross-sectional view of a magnified region M of FIG. 7 is illustrated, which illustrates backside recesses 43 formed by removal of the sacrificial material layers 42.

Referring to FIG. 8B, a conductive metallic compound layer 462 can be subsequently deposited in the backside recesses 43 and over the sidewall of the backside trench 79. The conductive metallic compound layer 464 can be deposited directly on the sidewalls and horizontal surfaces of the insulating layers 32 and physically exposed portions of the outer sidewalls of the memory films 50, or can be deposited directly on outer surfaces of an outer blocking dielectric layer (not shown) if such an outer blocking dielectric layer is employed. In one embodiment, the conductive metallic compound layer 462 can be a conductive metal nitride layer including a conductive metal nitride such as TiN, TaN, or WN, or can be a conductive metal carbide layer including a conductive metal carbide such as TiC, TaC, WC, or combinations thereof. The conductive metallic compound layer 462 can include a metallic material that functions as a barrier material layer, i.e., a material layer that functions as a diffusion barrier for impurity atoms or gases, and/or as an adhesion promoter layer, i.e., a material layer that promotes adhesion of subsequent layers to the insulating layers 32 (in case a backside blocking dielectric layer is not employed) or to a backside blocking dielectric layer (in case a backside blocking dielectric layer is employed). The conductive metallic compound layer 462 can be deposited by a conformal deposition process such as chemical vapor deposition (CVD) or atomic layer deposition (ALD). The thickness of the conductive metallic compound layer 462 can be in a range from 1 nm to 6 nm, although lesser and greater thicknesses can also be employed. A backside cavity 43', i.e., an unfilled volume, is present within each backside recess 43.

Referring to FIG. 8C, a semiconductor material layer 464 is deposited in the backside recesses and over a sidewall of the backside trench 79. The semiconductor material layer 464 can be deposited directly on the conductive metallic compound layer 462. The semiconductor material layer 464 includes a semiconductor material such as amorphous silicon, polysilicon, a silicon-germanium alloy, germanium, etc. In one embodiment, the semiconductor material layer 464 includes polysilicon. The semiconductor material layer 464 can be deposited by a conformal deposition method such as low pressure chemical vapor deposition (LPCVD) or atomic layer deposition (ALD). The thickness of the semiconductor material layer 464 can be selected such that a backside cavity 43' remains within each backside recess 43 after deposition of the semiconductor material layer 464 (i.e., to partially fill the recess 43).

Referring to FIG. 8D, the semiconductor material layer 464 is anisotropically etched. Portions of the semiconductor material layer 464 located within the backside trench 79 is removed by the anisotropic etch, while portions of the semiconductor material layer 464 within the backside recesses 43 are protected from the anisotropic etch by the overlying material portions (such as the insulating layers 32 and the conductive metallic compound layer 462). Each remaining portion of the semiconductor material layer 464 in the backside recesses constitutes a semiconductor material portion 46A. Each of the semiconductor material portions 46A comprises an upper horizontal portion overlying a respective backside cavity 43', a lower horizontal portion underlying the backside cavity 43', and a vertical portion adjacent to the backside cavity 43' and contacting a vertical sidewall of the conductive metallic compound layer 462.

Figure 8F:
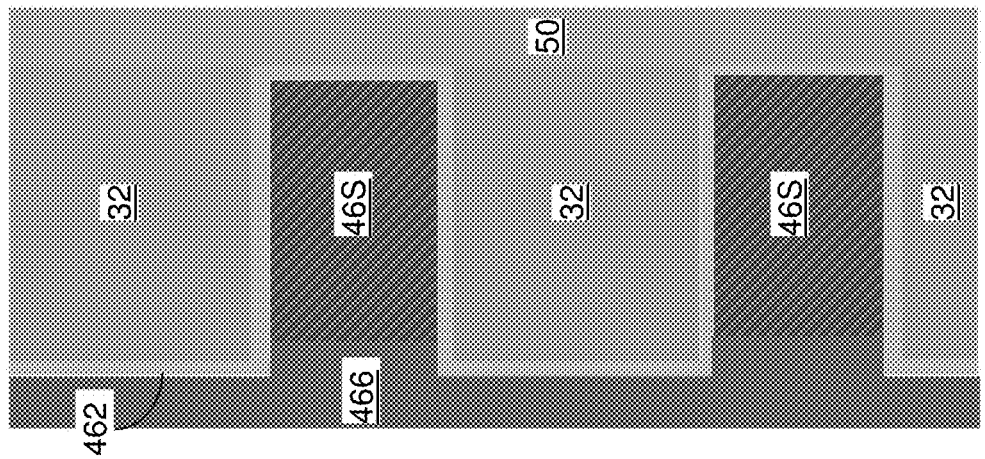
Figure 8E:
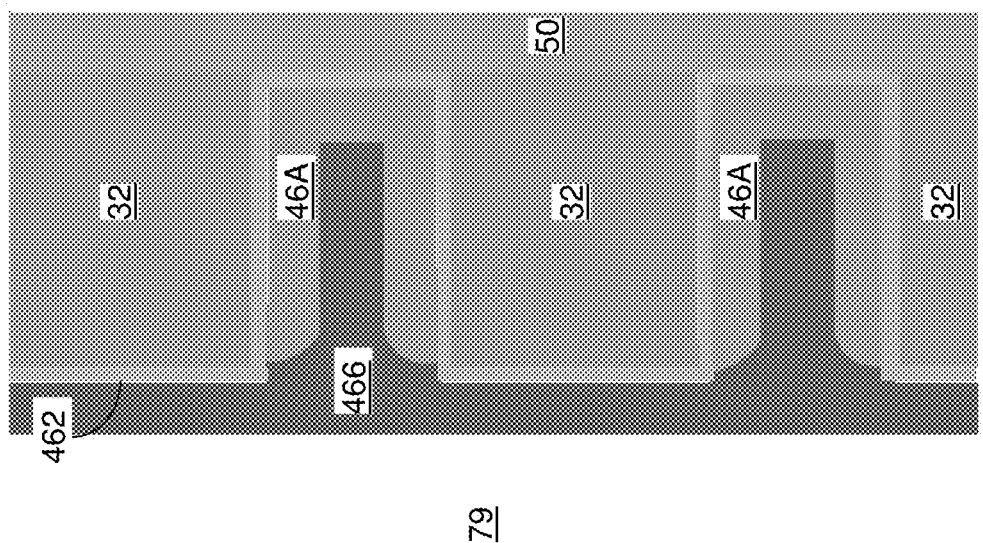

Referring to FIG. 8E, a metallic material layer 466 is deposited on remaining portions of the semiconductor material layer 464, i.e., on the semiconductor material portions 46A. The metallic material layer 466 can be deposited by a conformal deposition method such as chemical vapor deposition (CVD) or atomic layer deposition (ALD). Each backside cavity 43' can be filled with a portion of the metallic material layer 466 upon deposition of the metallic material layer 466.

The metallic material layer 466 can include any metallic material that reacts with the semiconductor material of the semiconductor material portions 46A to form a metal-semiconductor alloy material (e.g., a silicide, germanide, etc.). For example, the metallic material layer 466 can include an elemental metal such as cobalt, tungsten, titanium, tantalum, or an intermetallic alloy of at least two elemental metals. In one embodiment, the metallic material layer 466 can include cobalt. In one embodiment, the metallic material layer 466 can consist essentially of cobalt.

In one embodiment, the metallic material of the metallic material layer 466 can be elemental cobalt (i.e., a material consisting essentially of cobalt) or a cobalt-containing metallic alloy in which more than 50 at % (e.g., 75-100 at %, including 80-99 at %) of the atoms therein are cobalt atoms. The metallic material layer 466 can be deposited by a chemical vapor deposition (CVD) process or an atomic layer deposition (ALD) process that employs a cobalt-containing precursor gas. In one embodiment, the cobalt-containing precursor gas can be free of fluorine, i.e., does not contain fluorine. Chemical vapor deposition or atomic layer deposition of cobalt employs a cobalt precursor that can be easily vaporized to leave high-purity cobalt on a surface without causing surface damage. In one embodiment, an organometallic compound with relatively high vapor pressures and good thermal stability can be employed as the cobalt precursor gas to deposit cobalt without requiring hydrogen. In a non-limiting example, bis(cyclopentadienyl)cobalt, bis(ethylcyclopentadienyl)cobalt, bis(ethylcyclopentadienyl)cobalt, or bis(pentamethylcyclopentadienyl)cobalt can be employed as a cobalt precursor gas in a CVD or ALD process. Alternatively, different precursor gases (such as $Co_2(CO)_8$) can also be employed for cobalt deposition.

Referring to FIG. 8F, an anneal process is performed at an elevated temperature to induce reaction of the metal of the metallic material layer 466 and the semiconductor material portions 46A. The elevated temperature of the anneal process can be determined based on the compositions of the metallic material layer 466 and the semiconductor material portions 46A, and can be in a range from 500 degrees Celsius to 950 degrees Celsius, and typically in a range from 600 degrees Celsius to 800 degrees Celsius, although lesser and greater temperatures can also be employed. A metal-semiconductor alloy portion 46S including a metal-semiconductor alloy material can be formed within each backside recess 43.

Thus, the metal-semiconductor alloy material is formed within each backside recess 43 by reaction of the semiconductor material and the metallic material in the anneal process. In one embodiment, the semiconductor material of the semiconductor material portions 46A can comprise silicon, and the metal-semiconductor alloy material portions 46S can comprise a metal silicide. In one embodiment, the semiconductor material of the semiconductor material portions 46A can comprise silicon, the metallic material layer 466 can include cobalt, and the metal-semiconductor alloy material portions 46S can comprise cobalt silicide (e.g., $CoSi_2$ or non-stoichiometric silicide).

In one embodiment, the duration and the elevated temperature of the anneal process are selected such that the metal-semiconductor alloy portions 46S are contained with the volumes of the backside recesses 43, i.e., do not extend into the volume of the backside trench 79, which is defined by the outer vertical sidewalls of the insulating layers 32. In one embodiment, the entirety of each semiconductor material portion 46A can be reacted with the metallic material layer 466, and thus, consumed completely during the anneal process. In this case, all surfaces of the metal-semiconductor alloy portions 46S can contact a surface of the conductive metallic compound layer 462 or a surface of the unreacted portions of the metallic material layer 466. In one embodiment, the remaining unreacted portions of the metallic material layer 466 can be in a configuration of a single contiguous sheet in trench 79 without an opening therein. A sidewall of each metal-semiconductor alloy portion 46S may be laterally recessed with respect to a vertical plane including sidewalls of the insulating layers 32 in the trench 79.

Figure 8H:
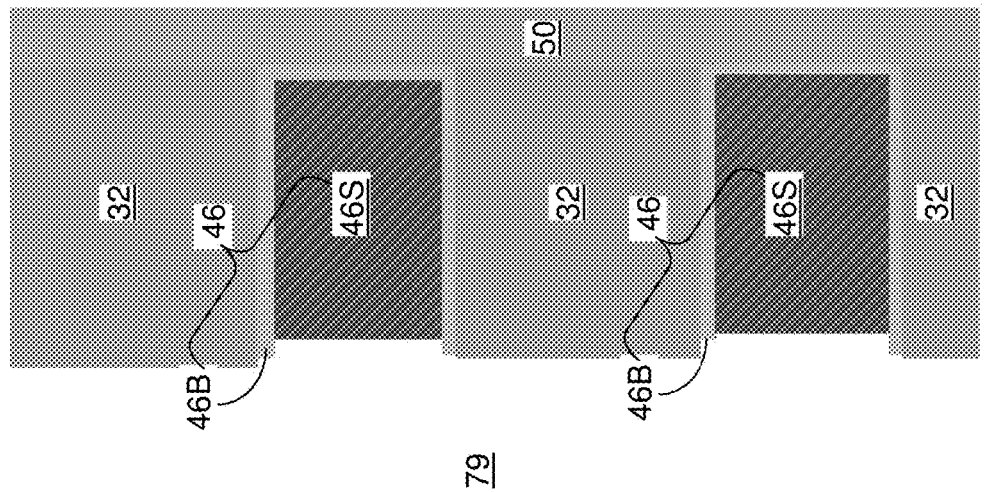
Figure 8G:
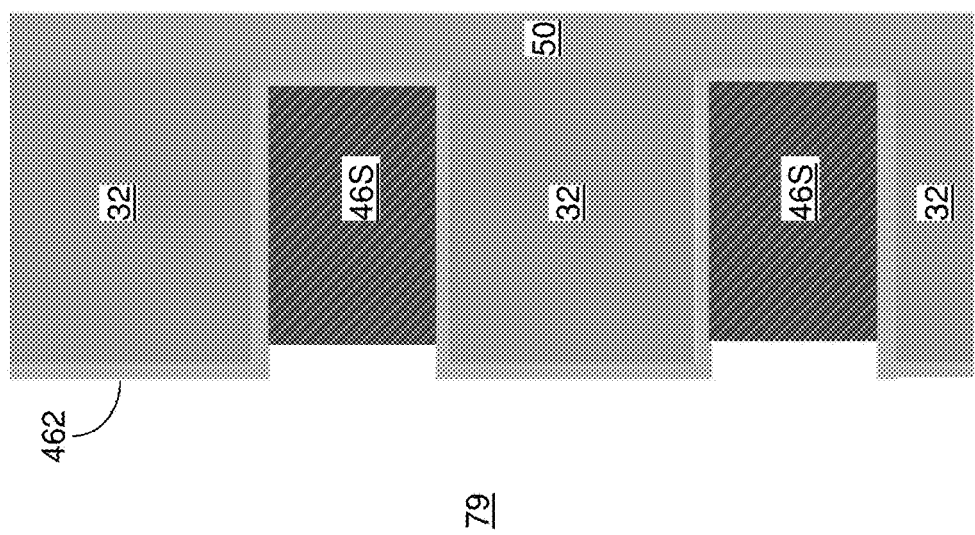

Referring to FIG. 8G, the remaining unreacted portions of the metallic material layer 466 can be removed selective to the metal-semiconductor alloy portions 46 by a selective etch process. The selective etch process etches the material of the metallic material layer 466, while not removing the material of the metal-semiconductor alloy portions 46S. A chemical etch process can be employed to remove the metallic material of the metallic material layer 466 selective to the metal-semiconductor alloy material. An exemplary chemical etch process that can be employed for selective removal of the metallic material layer 466 is a timed wet etch process employing an acidic and oxidizing mixture such as a sulfuric acid-hydrogen peroxide mixture. The unreacted portions of the metallic material layer 466, which is a conductive material, can be removed from each backside trench 79.

Referring to FIG. 8H, the physically exposed portions of the conductive metallic compound layer 462 (which includes a conductive material) are removed from inside each backside trench 79, for example, by an isotropic or anisotropic etch process, such as a selective wet etch process which does not etch portions 46S or layers 32. Remaining portions of the conductive metallic compound layer 462 constitute metallic liners 46B.

Portions of the metal-semiconductor alloy material within each backside recess, i.e., the metal-semiconductor alloy portions 46S, become electrically isolated from one another by removal of the physically exposed portions of the conductive metallic compound layer 462 (which comprises a conductive material) from each backside trench 79. Each remaining portion of the metal-semiconductor alloy material constitutes a portion of an electrically conductive layer 46 (e.g., a control gate electrode or word line of the memory device).

FIGS. 9A-9D illustrate processing steps employed to form second exemplary electrically conductive layers of a second embodiment of the disclosure, which are alternative structures for the first exemplary conductive layers. In the second embodiment, the metallic material layer 466 is deposited prior to the semiconductor material layer 464. The structure of FIG. 9A can be derived from the structure of FIG. 8B by depositing a metallic material layer 466 in the backside cavities 43' and in peripheral portions of the backside trench 79. The metallic material layer 466 can be formed directly on the surfaces of the conductive metallic compound layer 462. The metallic material layer 466 can have the same composition as the metallic material layer 466 formed at the processing steps of FIG. 8E. The metallic material layer 466 can be formed employing any of the deposition methods that can be employed to form the metallic material layer 466 of FIG. 8E. The thickness of the metallic material layer 466 is selected such that a lateral cavity 43' is present within each backside recess after deposition of the metallic material layer 466 (i.e., to partially fill the recesses 43). In one embodiment, the thickness of the metallic material layer 466 can be in a range from 2 nm to 20 nm, although lesser and greater thicknesses can also be employed.

Figure 9B:
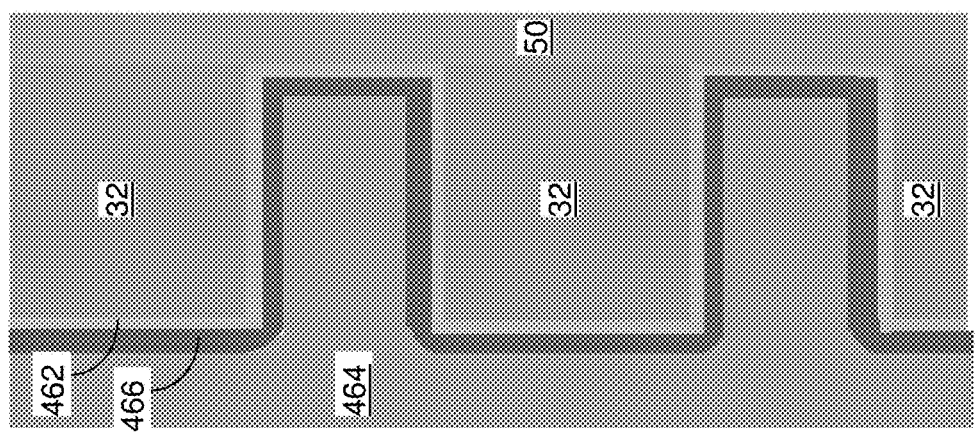
FIGS. 9A-9E are sequential vertical cross-sectional views of a magnified region M in FIG. 7 during formation of second exemplary electrically conductive layers according to a second embodiment of the present disclosure.
Figure 9A:
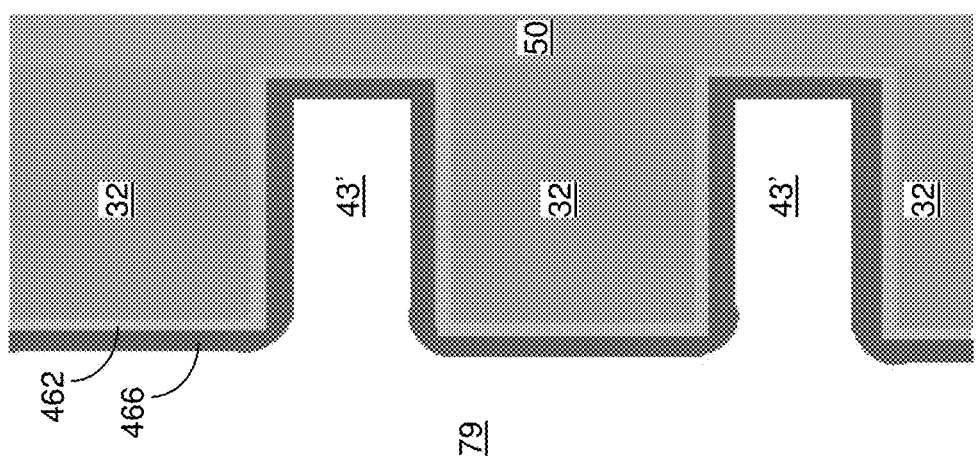

Referring to FIG. 9B, a semiconductor material layer 464 can be deposited in the backside cavities 43' and in peripheral portions of the backside trench 79. The semiconductor material layer 464 can be formed directly on the surfaces of the metallic material layer 466. The semiconductor material layer 464 can be formed on the entirety of the metallic material layer 466. The semiconductor material layer 464 can have the same composition as the semiconductor material layer 464 formed at the processing steps of FIG. 8C. The semiconductor material layer 464 can be formed employing any of the deposition methods that can be employed to form the semiconductor material layer 464 of FIG. 8C. The thickness of the semiconductor material layer 464 is selected such that each lateral cavity 43' is filled by the semiconductor material layer 464 after deposition of the semiconductor material layer 464. In one embodiment, the thickness of the semiconductor material layer 464, as measured on a sidewall of the metallic material layer 466 in a backside trench 79, can be in a range from 2 nm to 100 nm, although lesser and greater thicknesses can also be employed. Thus, a semiconductor material and a metallic material are deposited within each backside recess 43.

Figure 9D:
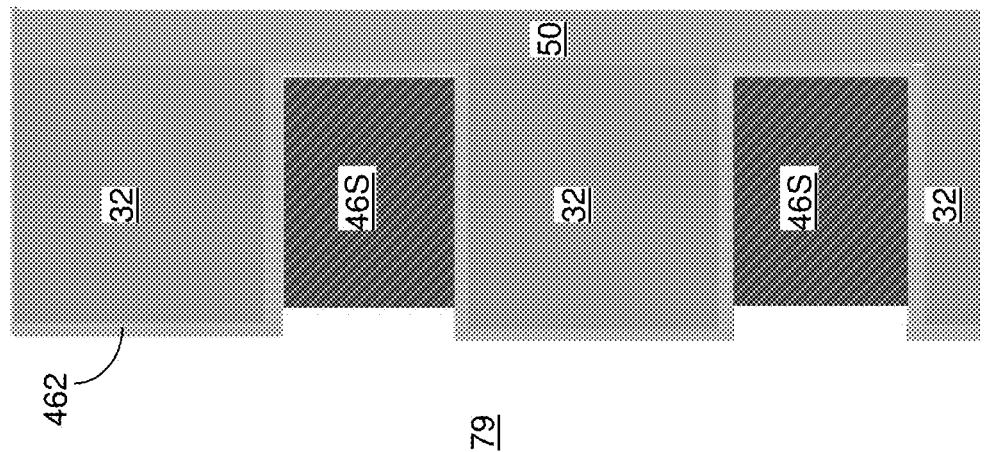
Figure 9C:
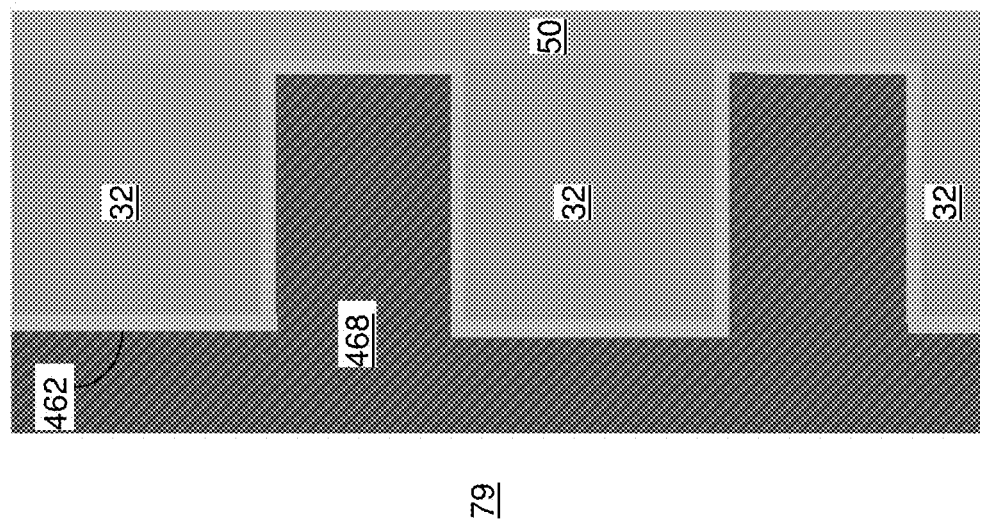

Referring to FIG. 9C, an anneal process is performed at an elevated temperature to induce reaction of the metal of the metallic material layer 466 and the semiconductor material layer 464. The elevated temperature of the anneal process can be determined based on the compositions of the metallic material layer 466 and the semiconductor material layer 464, and can be in a range from 500 degrees Celsius to 950 degrees Celsius, and typically in a range from 600 degrees Celsius to 800 degrees Celsius, although lesser and greater temperatures can also be employed. A metal-semiconductor alloy layer 468 including a metal-semiconductor alloy material can be formed within the backside recesses 43 and over sidewalls of the backside trench 79. The metal-semiconductor alloy layer 468 can be a contiguous layer that is connected to each portion of the metal-semiconductor alloy material in the backside recesses 43. The metal-semiconductor alloy layer 468 can be connected across multiple backside recesses as a contiguous material layer.

Thus, the metal-semiconductor alloy material is formed within each backside recess 43 by reaction of the semiconductor material and the metallic material in the anneal process. In one embodiment, the semiconductor material layer 464 can comprise amorphous silicon, polysilicon, a silicon-germanium alloy, or germanium, etc., and the metal-semiconductor alloy material layer 468 can comprise a metal silicide. In one embodiment, the semiconductor material layer 464 can comprise silicon, the metallic material layer 466 can include cobalt, and the metal-semiconductor alloy material layer 468 can comprise cobalt silicide.

In one embodiment, the duration and the elevated temperature of the anneal process are selected such that the entirety of the metallic material layer 466 is reacted with the semiconductor material of the semiconductor material layer 464. In this case, portions of the metal-semiconductor alloy layer 468 and portions of the conductive metallic compound layer 462 can completely fill each of the backside recesses 43.

Referring to FIG. 9D, an etch process is performed to remove portions of the metal-semiconductor alloy material (which is a conductive material) from inside the backside trench 79. Specifically, portions of the metal-semiconductor alloy layer 468 that are present in each backside trench 79 are removed by the etch process. The etch can be an isotropic etch (such as a timed selected wet etch which selectively etches layer 468) or an anisotropic etch (such as a reactive ion etch). For example, a wet etch including phosphoric acid or sulfuric acid, and optionally hydrogen peroxide, can be employed to remove the metal-semiconductor alloy material of the metal-semiconductor alloy layer 468.

The duration of the etch process is selected such that the metal-semiconductor alloy layer 468 is removed from each backside trench 79, the sidewalls of the conductive metallic compound layer 462 are physically exposed in each backside trench 79, and each remaining portion of the metal-semiconductor alloy material is confined within a volume of a backside recess 43. Each remaining portion of the metal-semiconductor alloy material is herein referred to as a metal-semiconductor alloy portion 46S. A sidewall of each metal-semiconductor alloy portion 46S may be laterally recessed with respect to a vertical plane including sidewalls of the insulating layers 32. The etch process may, or may not, be selective to the material of the conductive metallic material layer 462.

Figure 9E:
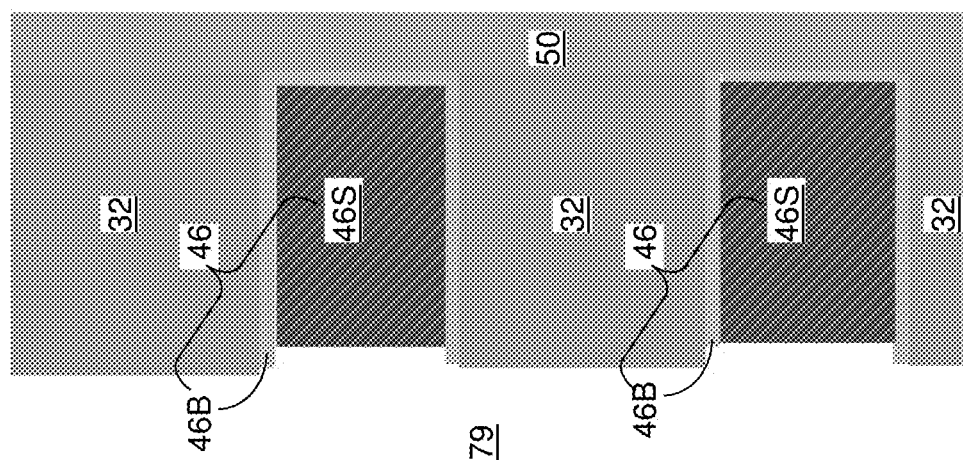

Referring to FIG. 9E, in case portions of the conductive metallic compound layer 462 are present on the sidewalls of the backside trench 79 (which are the sidewalls of the insulating layers 32), the physically exposed portions of the conductive metallic compound layer 462 is removed from inside each backside trench 79. The removal of the physically exposed portions of the conductive metallic compound layer 462 can be performed, for example, by an isotropic or anisotropic etch process, such as a selective wet etch process. Thus, additional conductive material (i.e., the material of the conductive metallic compound layer 462) can be removed from inside the backside trench 79. Remaining portions of the conductive metallic compound layer 462 constitute metallic liners 46B.

Portions of the metal-semiconductor alloy material within each backside recess, i.e., the metal-semiconductor alloy portions 46S, become electrically isolated from one another by removal of the physically exposed portions of the conductive metallic compound layer 462 (which comprises a conductive material) from each backside trench 79. Each remaining portion of the metal-semiconductor alloy material constitutes a portion of an electrically conductive layer 46.

Figure 10:
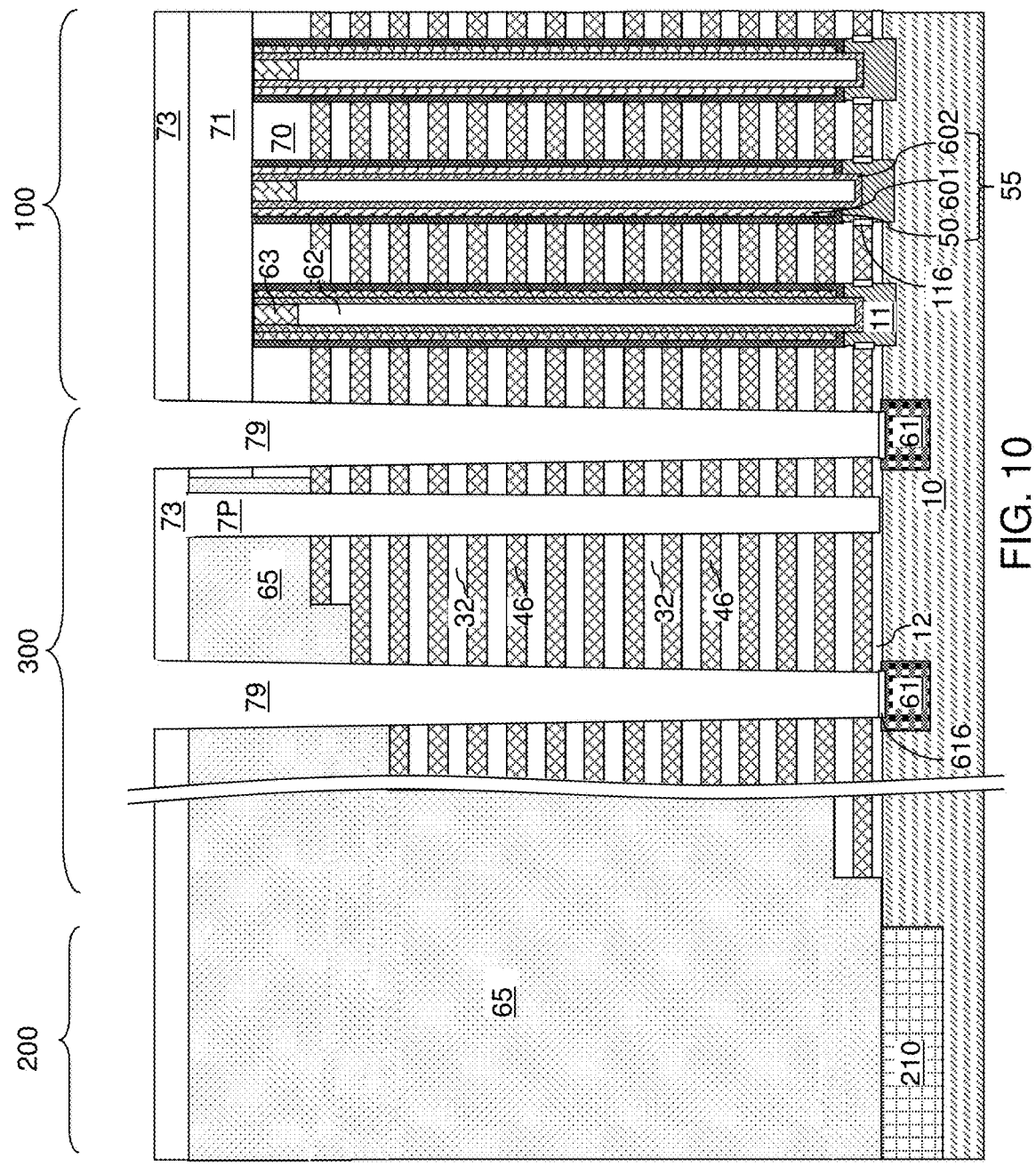
FIG. 10 is a vertical cross-sectional view of the exemplary structure after formation of electrically conductive lines according to an embodiment of the present disclosure.

Referring to FIG. 10, the exemplary structure is shown after formation of a plurality of electrically conductive layers 46, which can be a set of first exemplary electrically conductive layers 46 illustrated in FIG. 8H, or a set of second exemplary electrically conductive layers 46 illustrated in FIG. 9E.

Each electrically conductive layer 46 can function as a combination of a plurality of control gate electrodes and a word line electrically connecting, i.e., electrically shorting, the plurality of control gate electrodes. The plurality of control gate electrodes within each electrically conductive layer 46 can include control gate electrodes located at the same level for the vertical memory devices including the memory stack structures 55. In other words, each electrically conductive layer 46 can be a word line that functions as a common control gate electrode for the plurality of vertical memory devices.

Figure 11A:
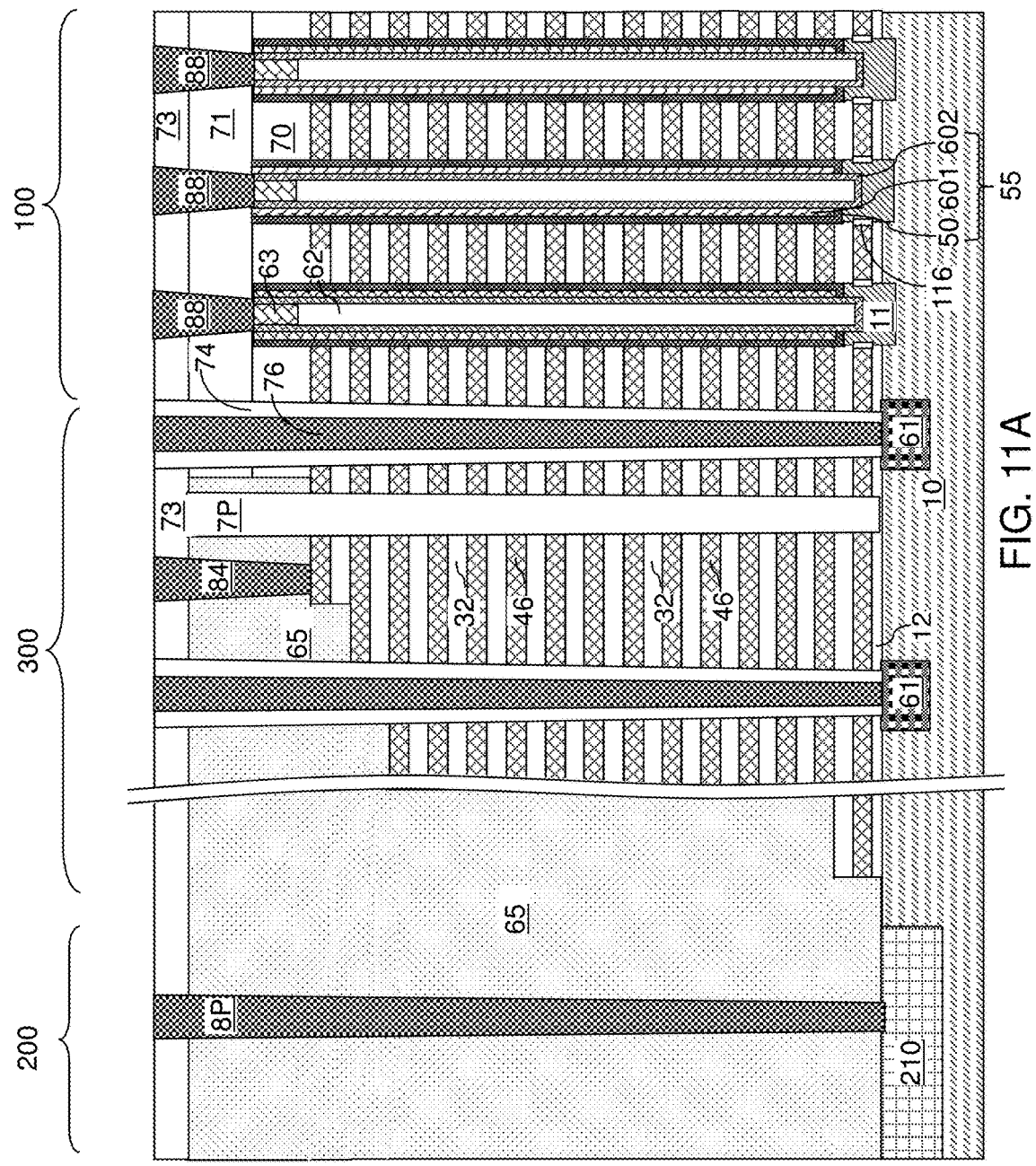
FIG. 11A is a vertical cross-sectional view of the exemplary structure after formation of various contact via structures according to an embodiment of the present disclosure.
Figure 11B:
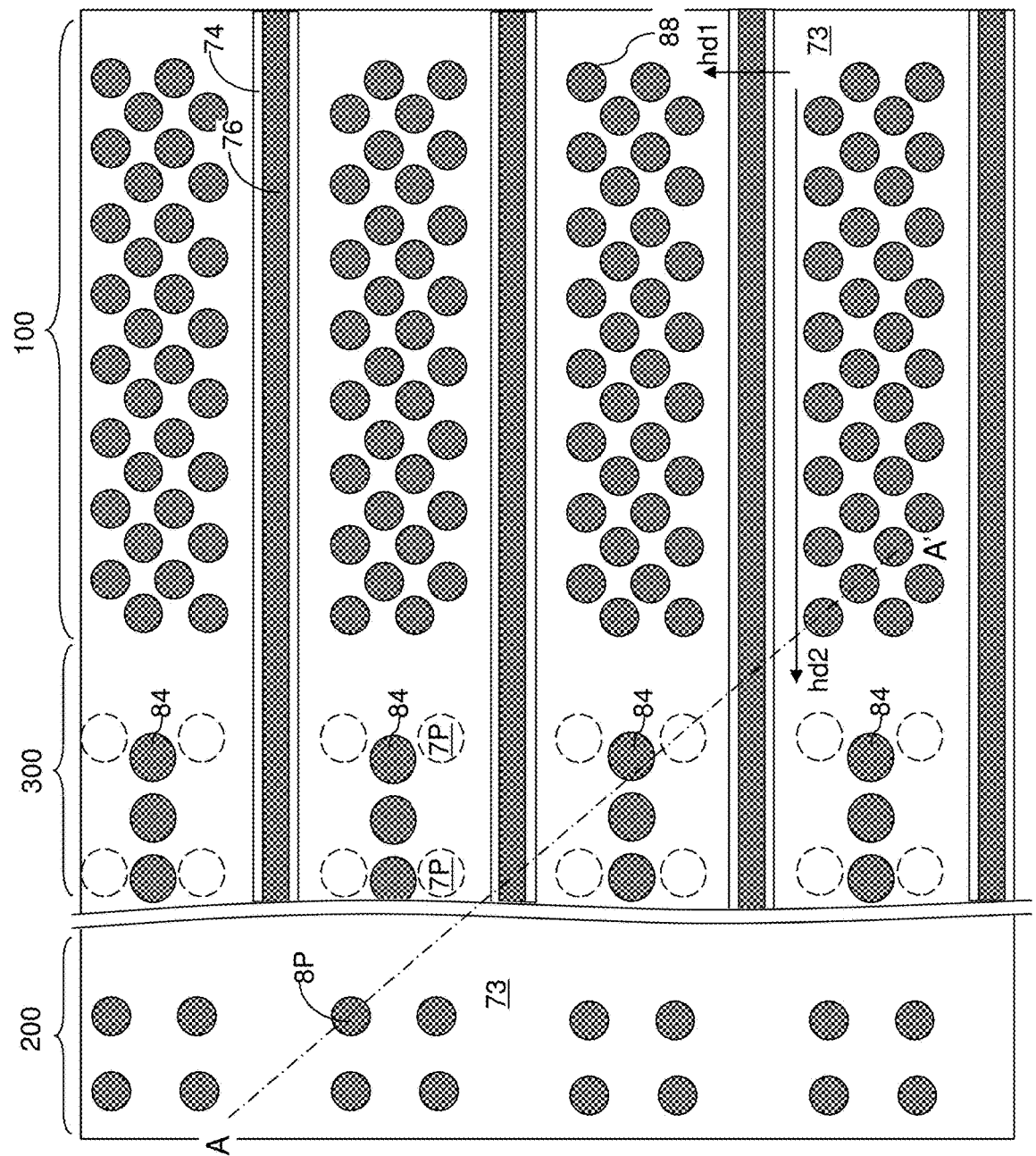
FIG. 11B is a see-through top-down view of the exemplary structure of FIG. 11A. The vertical plane A-A' is the plane of the vertical cross-sectional view of FIG. 11A.

Referring to FIGS. 11A and 11B, an insulating spacer 74 can be formed on the sidewalls of each backside trench 79 by deposition of a contiguous dielectric material layer and an anisotropic etch of its horizontal portions. Each insulating spacer 74 includes a dielectric material, which can comprise, for example, silicon oxide, silicon nitride, a dielectric metal oxide, a dielectric metal oxynitride, or a combination thereof. The thickness of each insulating spacer 74, as measured at a bottom portion thereof, can be in a range from 1 nm to 50 nm, although lesser and greater thicknesses can also be employed. In one embodiment, the thickness of the insulating spacer 74 can be in a range from 3 nm to 10 nm.

A photoresist layer (not shown) can be applied over the topmost layer of the exemplary structure (which can be, for example, the dielectric pillar material layer 73) and in the cavity laterally surrounded by the insulating spacer 74, and is lithographically patterned to form various openings in the device region 100, the peripheral device region 200, and the contact region 300. The locations and the shapes of the various openings are selected to correspond to electrical nodes of the various devices to be electrically contacted by contact via structures. In one embodiment, a single photoresist layer may be employed to pattern all openings that correspond to the contact via cavities to be formed, and all contact via cavities can be simultaneously formed by at least one anisotropic etch process that employs the patterned photoresist layer as an etch mask. In another embodiment, a plurality of photoresist layers may be employed in combination with a plurality of anisotropic etch processes to form different sets of contact via cavities with different patterns of openings in the photoresist layers. The photoresist layer(s) can be removed after a respective anisotropic etch process that transfers the pattern of the openings in the respective photoresist layer through the underlying dielectric material layers and to a top surface of a respective electrically conductive structure.

In an illustrative example, drain contact via cavities can be formed over each memory stack structure 55 in the device region 100 such that a top surface of a drain region 63 is physically exposed at the bottom of each drain contact via cavity. Word line contact via cavities can be formed to the stepped surfaces of the alternating stack (32, 46) such that a top surface of an electrically conductive layer 46 is physically exposed at the bottom of each word line contact via cavity in the contact region 300. A device contact via cavity can be formed to each electrical node of the peripheral devices 210 to be contacted by a contact via structure in the peripheral device region.

The various via cavities can be filled with at least one conductive material, which can be a combination of an electrically conductive metallic liner material (such as TiN, TaN, or WN) and a metallic fill material (such as W, Cu, or Al). Excess portions of the at least one conductive material can be removed from above the at least one contact level dielectric layer (71, 73) by a planarization process, which can include, for example, chemical mechanical planarization (CMP) and/or a recess etch. Drain contact via structures 88 can be formed on the respective drain regions 63. Word line contact via structures 84 can be formed on the respective electrically conductive layers 46. Peripheral device contact via structures 8P can be formed on the respective nodes of the peripheral devices 210. A backside contact via structure 76 can be formed within each cavity laterally surrounded by an insulating spacer 74. Additional metal interconnect structures (not shown) and interlayer dielectric material layers (not) shown can be formed over the exemplary structure to provide electrical wiring among the various contact via structures.

The exemplary structure can include a three-dimensional memory device. The three-dimensional memory device can include an alternating stack of insulating layers 32 and electrically conductive layers 46 and located over a substrate (e.g., semiconductor substrate layer 10), and memory stack structures 55 extending through the alternating stack (32, 46). Each of the electrically conductive layers 46 comprises a metal-semiconductor alloy portion 46S and a metallic liner 46B. The metallic liners 46B laterally separate the metal-semiconductor alloy portions 46S from the memory stack structures 55, from a respective overlying insulating layer (32 or 70), and from a respective underlying insulating layer (32 or 12). The metal-semiconductor alloy portion 46S contacts a sidewall and two horizontal surfaces of a respective metallic liner 46B.

In one embodiment, the metal-semiconductor alloy portions 46S comprise cobalt silicide. The three-dimensional memory device can further comprise an insulating spacer 74 located within a backside trench 79 that extends through the alternating stack, and a contact via structure 76 embedded within the insulating spacer 74, wherein a sidewall of each metal-semiconductor alloy portion 46S contacts an outer sidewall of the insulating spacer 74. In one embodiment, each surface of a metal-semiconductor alloy portion 46S can be in physical contact with a surface of a respective metallic liner 46B or the outer sidewall of the insulating spacer 74.

In one embodiment, each electrically conductive layer 46 can comprise a metallic liner 46B contacting a respective metal-semiconductor alloy portion 46S. In one embodiment, the metallic liner 46B contacts a vertical sidewall surface, a planar top surface, and a planar bottom surface of the respective metal-semiconductor alloy portion 46S. In one embodiment, a sidewall of each metal-semiconductor alloy portion 46S is laterally recessed with respect to a vertical plane including sidewalls of the insulating layers 32.

In one embodiment, the three-dimensional memory device can include a backside trench 79 that extends through the alternating stack (32, 42), and optionally backside blocking dielectric layer (not shown for clarity) located on sidewalls of the backside trench 79 and between each neighboring pair of an insulating layer 32 and an electrically conductive layer 46.

In one embodiment, the device located on the semiconductor substrate can include a vertical NAND device located in the device region 100, and at least one of the electrically conductive layers 46 in the stack (32, 46) can comprise, or can be electrically connected to, a word line of the NAND device. The device region 100 can include a plurality of semiconductor channels (601, 602). At least one end portion of each of the plurality of semiconductor channels (601, 602) extends substantially perpendicular to a top surface of the semiconductor substrate. The device region 100 further includes a plurality of charge storage regions located within each memory layer 50. Each charge storage region is located adjacent to a respective one of the plurality of semiconductor channels (601, 602). The device region 100 further includes a plurality of control gate electrodes having a strip shape extending substantially parallel to the top surface of the semiconductor substrate layer 10. The plurality of control gate electrodes comprise at least a first control gate electrode located in the first device level and a second control gate electrode located in the second device level. The plurality of electrically conductive layers 46 in the stack (32, 46) can be in electrical contact with, or can comprise, the plurality of control gate electrodes, and extends from the device region 100 to a contact region 300 including a plurality of electrically conductive contact via structures.

In case the exemplary structure includes a three-dimensional NAND device, a stack (32, 46) of an alternating plurality of word lines 46 and insulating layers 32 can be located over a semiconductor substrate. Each of the word lines 46 and insulating layers 32 is located at different levels that are vertically spaced from a top surface of the semiconductor substrate by different distances. An array of memory stack structures 55 is embedded within the stack (32, 46). Each memory stack structure 55 comprises a semiconductor channel (601, 602) and at least one charge storage region located adjacent to the semiconductor channel (601, 602). At least one end portion of the semiconductor channel (601, 602) extends substantially perpendicular to the top surface of the semiconductor substrate through the stack (32, 46).

The embodiments of the disclosure provide the following non-limiting advantages. Cobalt silicide (e.g., $CoSi_2$) is a highly stable material word line which is thermally stable up to 950° C. for 30 minutes and resists oxidation up to 900° C. This material can also be deposited conformally and allows selective etching of unreacted cobalt using a simple wet etch after the cobalt is reacted with the sacrificial silicon layer 464. Finally, cobalt silicide does not require use of a fluorine containing gas source typically used to deposit tungsten word lines, which may cause voids in the word lines, and cobalt silicide word lines have a lower stress than tungsten word lines, which results in less warping of the substrate.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of manufacturing a three-dimensional memory device, comprising:

forming an alternating stack comprising insulating layers and sacrificial material layers over a substrate;

forming memory openings through the alternating stack;
forming memory stack structures in the memory openings, wherein each of the memory stack structures extends through the alternating stack and is formed within a respective memory opening;
forming a backside trench through the alternating stack after formation of the memory stack structures;
forming backside recesses around the memory stack structures by removing the sacrificial material layers through the backside trench;
depositing a semiconductor material layer including a semiconductor material in the backside recesses and over a sidewall of the backside trench;
anisotropically etching the semiconductor material layer, wherein the semiconductor material is removed from inside the backside trench and remaining portions of the semiconductor material layer are located entirely within the backside recesses and outside of the memory openings and outside of the backside trench, and constitute semiconductor material portions, wherein each of the semiconductor material portions is formed within a first volume of a respective one of the backside recesses, a second volume of the respective one of the backside recesses is not filled with the semiconductor material and forms a respective cavity, and each of the semiconductor material portions comprises an upper horizontal portion overlying the respective cavity, a lower horizontal portion underlying the respective cavity, and a vertical portion adjacent to the respective cavity and connecting the upper horizontal portion and the lower horizontal portion;
depositing a metallic material layer including a metallic material on the semiconductor material portions and within each of the cavities within the backside recesses and directly on surfaces of the semiconductor material portions that are within the backside recesses;
forming a metal-semiconductor alloy material portion within each backside recess by reacting the semiconductor material of the semiconductor material portions and the metallic material in an anneal process without forming any metal-semiconductor alloy material within a volume of the backside trench, wherein the metal-semiconductor alloy material portions do not contact one another and are formed entirely within respective backside recesses and an unreacted portion of the metallic material layer continuously extends from a bottommost insulating layer provided in the alternating stack to a topmost insulating layer provided in the alternating stack;
removing the unreacted portion of the metallic material layer selective to the metal-semiconductor alloy portions, wherein the metal-semiconductor alloy material portions within each backside recess are electrically isolated from one another at least by removing the unreacted portion of the metallic material layer from the backside trench, wherein each metal-semiconductor alloy material portion constitutes a portion of an electrically conductive layer upon removal of the unreacted portion of the metallic material layer;
depositing a conductive metallic compound layer on surfaces of the insulating layers and the memory stack structures, wherein the electrically conductive layers are formed on the conductive metallic compound layer; and
removing portions of the conductive metallic compound layer from inside the backside trench, wherein remaining portions of the conductive metallic compound layer constitute metallic liners,
wherein:
removal of the semiconductor material from inside the backside trench is performed selective to the conductive metallic compound layer;
the metallic material layer is deposited directly on vertical sidewalls of the conductive metallic compound layer;
the metallic material layer is removed while the conductive metallic compound layer is present on sidewalls of the insulating layers; and
vertical portions of the conductive metallic compound layer located at levels of the insulating layers are removed after removal of the metallic material layer.

2. The method of claim 1, wherein a portion of the metallic material layer fills the cavities inside the backside recesses upon deposition of the metallic material layer.

3. The method of claim 1, wherein the conductive metallic compound layer comprises a conductive metal nitride, a conductive metal carbide, or a combination thereof.

4. The method of claim 1, wherein the metal-semiconductor alloy material portions contact sidewalls of vertical portions of the conductive metallic compound layer contacting the memory stack structures.

5. The method of claim 1, wherein the semiconductor material comprises silicon, and the metal-semiconductor alloy material comprises a metal silicide.

6. The method of claim 5, wherein the metallic material comprises cobalt, and the metal silicide comprises cobalt silicide.

7. The method of claim 1, wherein each of the memory stack structures comprises, from inside to outside:
a semiconductor channel;
a tunneling dielectric layer laterally surrounding the semiconductor channel; and
a vertical stack of charge storage regions laterally surrounding the tunneling dielectric layer.

8. The method of claim 1, wherein:
the three-dimensional memory device comprises a vertical NAND device formed in a device region;
the electrically conductive layers comprise, or are electrically connected to a respective word line of the NAND device;
the device region comprises:
a plurality of semiconductor channels, wherein at least one end portion of each of the plurality of semiconductor channels extends substantially perpendicular to a top surface of the substrate;
a plurality of charge storage regions, each charge storage region located adjacent to a respective one of the plurality of semiconductor channels; and
a plurality of control gate electrodes having a strip shape extending substantially parallel to the top surface of the substrate;
the plurality of control gate electrodes comprise at least a first control gate electrode located in a first device level and a second control gate electrode located in a second device level;
the electrically conductive layers in the stack are in electrical contact with the plurality of control gate electrode and extend from the device region to a contact region including the plurality of electrically conductive via connections; and
the substrate comprises a silicon substrate containing a driver circuit for the NAND device.

9. The method of claim 1, wherein the electrically conductive layers comprising the metal-semiconductor alloy portions comprise control gate electrodes of the memory device.

* * * * *